(12) United States Patent
Nakajima

(10) Patent No.: US 6,803,601 B2
(45) Date of Patent: Oct. 12, 2004

(54) SEMICONDUCTOR DEVICE AND PROCESS FOR PRODUCTION THEREOF

(75) Inventor: Setsuo Nakajima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 29 days.

(21) Appl. No.: 10/140,424

(22) Filed: May 6, 2002

(65) Prior Publication Data

US 2002/0142554 A1 Oct. 3, 2002

Related U.S. Application Data

(62) Division of application No. 09/441,258, filed on Nov. 16, 1999, now Pat. No. 6,420,758.

(30) Foreign Application Priority Data

Nov. 17, 1998 (JP) .......................................... 10-327356

(51) Int. Cl.[7] .............................................. H01L 29/04
(52) U.S. Cl. .......................................... 257/59; 257/72
(58) Field of Search ........................... 257/59, 72, 347, 257/350, 351, 366; 438/149

(56) References Cited

U.S. PATENT DOCUMENTS

| | | | |
|---|---|---|---|
| 5,247,190 A | 9/1993 | Friend et al. | |
| 5,399,502 A | 3/1995 | Friend et al. | |
| 5,643,826 A | 7/1997 | Ohtani et al. | |
| 5,712,495 A | 1/1998 | Suzawa | |
| 5,861,347 A | * 1/1999 | Maiti et al. | 438/787 |
| 5,923,962 A | 7/1999 | Ohtani et al. | |
| 6,166,414 A | 12/2000 | Miyazaki et al. | |
| 6,259,138 B1 | 7/2001 | Ohtani et al. | |
| 6,420,758 B1 | * 7/2002 | Nakajima | 257/350 |
| 6,512,271 B1 | * 1/2003 | Yamazaki et al. | 257/350 |
| 2002/0175376 A1 | 11/2002 | Ohtani et al. | |

FOREIGN PATENT DOCUMENTS

| | | |
|---|---|---|
| EP | 1 005 094 A2 | 5/2000 |
| JP | 7-130652 | 5/1995 |
| JP | 8-078329 | 3/1996 |
| JP | 10-092576 | 4/1998 |
| JP | 10-135468 | 5/1998 |
| JP | 10-135469 | 5/1998 |
| JP | 2000-183356 | 6/2000 |
| WO | WO 90/13148 | 11/1990 |

OTHER PUBLICATIONS

Schenk, H. et al., "Polymers for Light Emitting Diodes," EuroDisplay '99, Proceedings of the 19th International Display Research Conference, Sep. 6–9, 1999, Berlin, Germany, pp. 33–37.

Hatano, M. et al., "A novel Self–Aligned Gate–Overlapped LDD Poly–Si TFT with High Reliability and Performance," IEDM Technical Digest '97, International Election Devices Meeting, Dec. 7–10, 1997, Washington D.C., pp. 523–526.

* cited by examiner

Primary Examiner—W. David Coleman
(74) Attorney, Agent, or Firm—Cook, Alex, McFarron, Manzo, Cummings & Mehler, Ltd.

(57) ABSTRACT

An object of the present invention is to provide a TFT of new structure in which the gate electrode overlaps with the LDD region and a TFT of such structure in which the gate electrode does not overlap with the LDD region. The TFT is made from crystalline semiconductor film and is highly reliable.

The TFT of crystalline semiconductor film has the gate electrode formed from a first gate electrode 113 and a second gate electrode in close contact with said first gate electrode and gate insulating film. The LDD is formed by ion doping using said first gate electrode as a mask, and the source-drain region is formed using said second gate electrode as a mask. After that the second gate electrode in the desired region is selectively removed. In this way it is possible to form LDD region which overlaps with the second gate electrode.

51 Claims, 21 Drawing Sheets

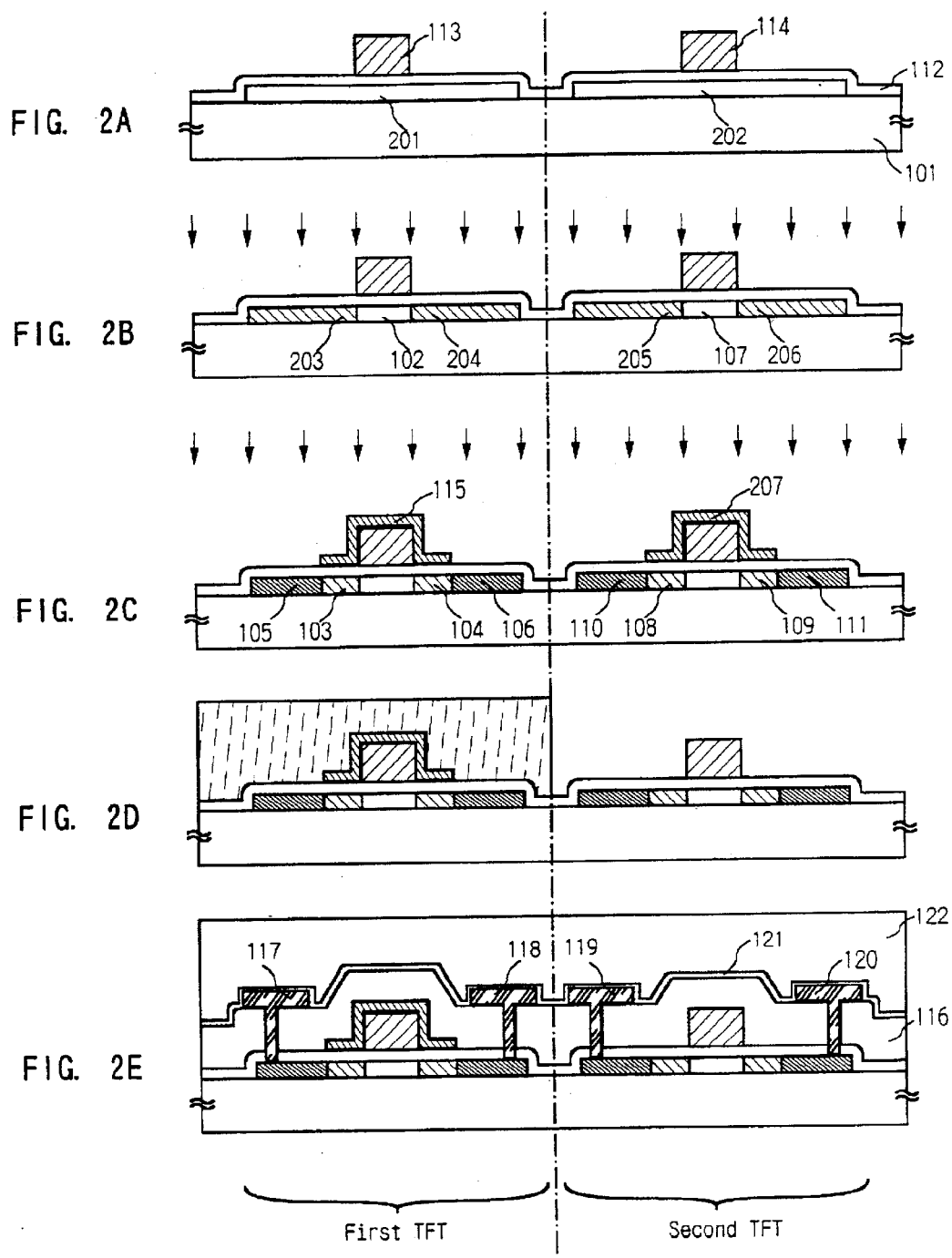

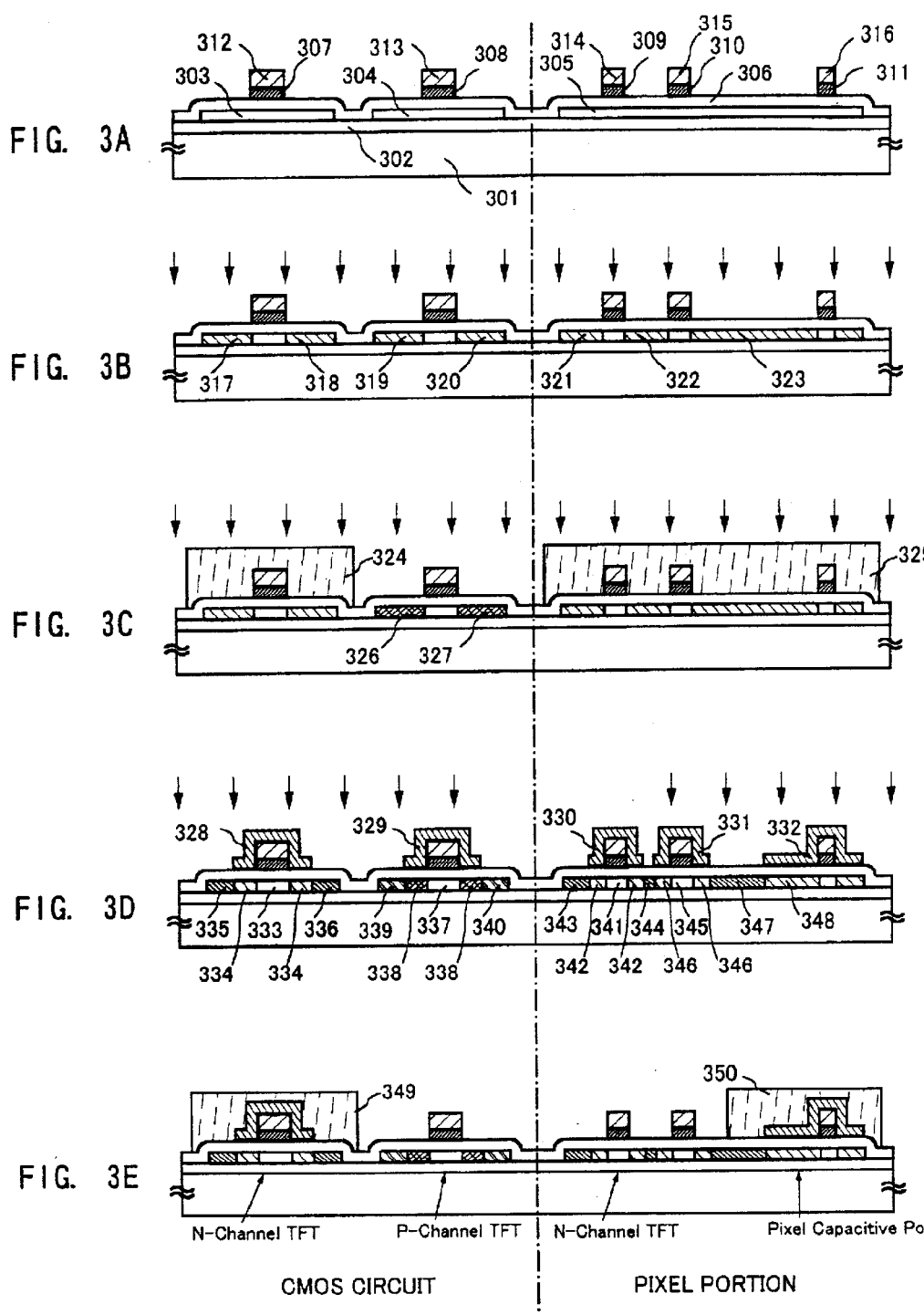

N-Channel TFT | P-Channel TFT | N-Channel TFT | Pixel Capacitive Portion

B •----------------• B'  A •----------------• A'

CMOS CIRCUIT | PIXEL PORTION

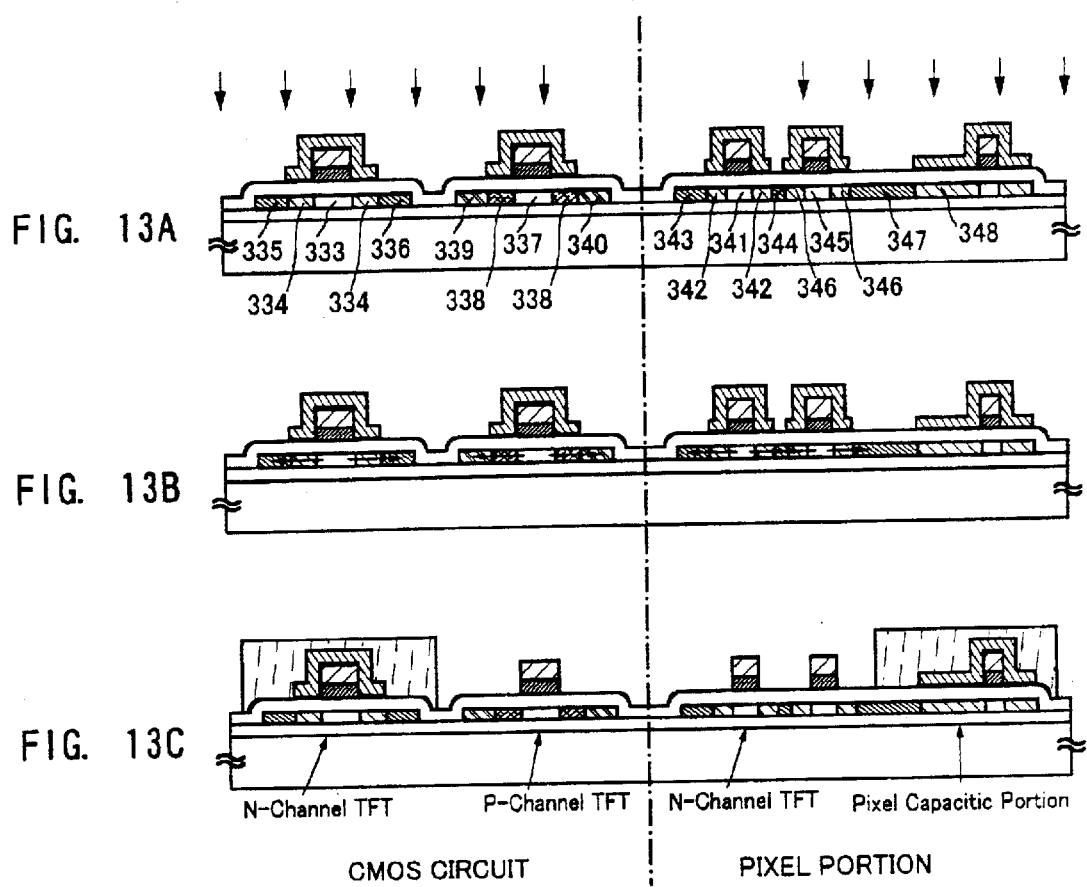

SEMICONDUCTOR DEVICE AND PROCESS FOR PRODUCTION THEREOF

This application is a divisional of U.S. application Ser. No. 09/441,258, filed on Nov. 16, 1999 now U.S. Pat. No. 6,420,758.

BACKGROUND OF THE INVENTION

1. Field of the Invention

The present invention relates to a semiconductor device having circuits composed of thin-film transistors. More particularly, the present invention relates to an electro-optical device represented by a liquid-crystal display unit and also to a structure of electronic machines and equipment equipped with such electro-optical devices. The term "semiconductor device" as used in this specification generally denotes any device which functions by utilizing the semiconductor characteristics and hence it embraces said electro-optical devices and electronic machines and equipment equipped with said electro-optical devices.

2. Description of the Related Arts

Considerable efforts have been directed to the application of thin-film transistors (TFT for short hereinafter) to liquid crystal display units of active matrix type because of their ability to be formed on a transparent glass substrate. TFTs based on polysilicon film have such high mobility that they are expected to give a precision image if their functional circuits are integrated on a single substrate.

A liquid crystal display unit of active matrix type needs as many TFTs as million for pixels alone if it is to produce an image of high resolution. When it is provided with functional circuits, it needs more TFTs. For its stable operation, it requires individual TFTs to work with good stability and reliability.

In a liquid crystal display unit of active matrix type, each pixel is constructed of n-channel type TFT, which is required to meet the characteristics of both on-region and off-region because a gate voltage applied to it ranges from about 15 to 20V. On the other hand, peripheral circuits to drive the pixel are composed mainly of CMOS circuits, which rely greatly on the characteristics of on-region.

Unfortunately, TFTs made of polysilicon film tend to increase in off-current (leakage current). This leads to a decrease in mobility and on-current after prolonged operation. A probable reason for this trouble is an increase in channel electric field which gives rise to hot carriers and deteriorates the characteristic properties.

A well-known way in the field of MOS transistor to prevent the deterioration of characteristic properties due to hot carriers, thereby improving reliability, is to adopt the LDD (Lightly Doped Drain) structure. This structure is characterized by an impurity region of lower concentration which is formed inside the source-drain region. This region is called LDD region. The LDD structure permits the off-current to be reduced more than the ordinary TFT structure.

MOS transistors are constructed such that the LDD region overlaps to some extent with the gate electrode, with a gate insulating film interposed between them. This structure is known as, for example, GOLD (Gate-drain overlapped LDD) and LATID (Large-tilt-angle implanted drain), which are made in different ways. These structures make it possible to reduce the impurity concentration in the LDD region, thereby reliving the electric field and improving the hot carrier resistance.

Attempts are being made to apply the technology of MOS transistor to TFT. For example, GOLD structure with side wall of silicon is reported in "M. Hatano, H. Akimoto, and T. Sakai, IEDM97 TECHNICAL DIGEST, p. 523–526, 1997".

The structure reported in this paper presents difficulties in leaving the gate insulating film highly selectively in the anisotropic etching of film for the side wall. This leads to variation in characteristic properties.

In addition, the structure reported in this paper has a larger off-current (the current that flows when TFT is in off state) than the ordinary LDD structure. Therefore, when TFTs of the reported structure are used as switching elements to drive pixel electrodes, they consume more electric power and display anomalous images due to large off-current. The increase in off-current is due to the fact that an inversion layer is formed in the LDD region which overlaps with the gate electrode and this inversion layer functions as the hole passage.

OBJECT AND SUMMARY OF THE INVENTION

The present invention was completed in order to overcome the above-mentioned problems. It is an object of the present invention to provide a first TFT of new structure in which the gate electrode overlaps with the LDD region. It is another object of the present invention to provide a second TFT of such structure in which the gate electrode does not overlap with the LDD region. It is further another object of the present invention to provide a technology to produce simultaneously a first TFT of new structure in which the gate electrode overlaps with the LDD region and a second TFT of such structure in which the gate electrode does not overlap with the LDD region. It is still further another object of the present invention to provide an excellent semiconductor device whose circuits are constructed of TFTs with high driving performance and TFTs with high reliability.

The first aspect of the present invention is a semiconductor device equipped with a first semiconductor element and a second semiconductor element on the same insulating surface, characterized in that said first semiconductor element has a gate insulating film, a first gate electrode formed adjacent to said gate insulating film, a second gate electrode which covers said first gate electrode and is formed adjacent to said gate insulating film, a channel-forming region which overlaps with the region in contact with said gate insulating film of said first gate electrode, with said gate insulating film interposed between them, and an impurity region which overlaps with the region in contact with said gate insulating film of said second gate electrode, with said gate insulating film interposed between them, and said second semiconductor element has said gate insulating film, a third gate electrode formed adjacent to said gate insulating film, and an impurity region which does not overlap with said third gate electrode.

The second aspect of the present invention is a semiconductor device equipped with a high voltage circuit consisting of a first semiconductor element and a high speed drive circuit consisting of a second semiconductor element on the same insulating surface, characterized in that said high voltage circuit consists of a first semiconductor element which has a gate insulating film, a first gate electrode formed adjacent to said gate insulating film, a second gate electrode which covers said first gate electrode and is formed adjacent to said gate insulating film, a channel-forming region which overlaps with the region in contact with said gate insulating film of said first gate electrode, with said gate insulating film interposed between them, and said high-speed drive circuit consists of a second semiconductor element which has said gate insulating film, a third gate electrode formed adjacent to said gate insulting film, and an impurity region which does not overlap with said third gate electrode.

The third aspect of the present invention is a semiconductor device containing pixels each formed from an n-channel type thin film transistor and CMOS circuits each formed from an n-channel type thin film transistor and a p-channel type thin film transistor, characterized in that the n-channel type thin film transistor of said pixels has a gate insulating film, a first gate electrode formed adjacent to said gate insulating film, a second gate electrode which covers said first gate electrode and is formed adjacent to said gate insulating film, a channel-forming region which overlaps with the region in contact with said gate insulating film of said first gate electrode, with said gate insulating film interposed between them, and an impurity region which overlaps with the region in contact with said gate insulating film of said second gate electrode, with said gate insulating interposed between them, and the n-channel type thin film transistor of said CMOS circuit has a gate insulating film, a third gate electrode formed adjacent to said gate insulating film, and an impurity region which does not overlap with said third gate electrode.

The foregoing structure is characterized in that said second semiconductor element does not have said second gate electrode.

The foregoing structure is characterized in that said impurity region is in contact with said channel forming region.

The foregoing structure is characterized in that said impurity region contains an impurity element of Group 15 in an amount of $1 \times 10^{16}$ to $1 \times 10^{19}$ atms/cm$^3$.

The fourth aspect of the present invention is a semiconductor device containing CMOS circuits each formed from an n-channel type thin film transistor and a p-channel type thin film transistor, characterized in that said n-channel type thin film transistor has a gate insulating film, a first gate electrode formed adjacent to said gate insulating film, a second gate electrode which covers said first gate electrode and is formed adjacent to said gate insulating film, a channel-forming region which overlaps with the region in contact with said gate insulating film of said first gate electrode, with said gate insulating film interposed between them, and an impurity region which overlaps with the region in contact with said gate insulating film of said second gate electrode, with said gate insulating film interposed between them, and said p-channel type thin film transistor has a gate insulating film, a first gate electrode formed adjacent to said gate insulating film, and an impurity region which does not overlap with said first gate electrode.

The foregoing structure is characterized in that said first gate electrode is a single layer or multiple layer formed from a metal (as simple substance) or an alloy thereof, such as tantalum (Ta), tantalum nitride (TaN), titanium (Ti), chromium (Cr), tungsten (W), molybdenum (Mo), silicon (Si), aluminum (Al), and copper (Cu).

The foregoing structure is characterized in that the material for said second gate electrode is different from that for said first gate electrode.

The present invention is characterized by the structure of the first semiconductor element (the first thin film transistor) and the structure of the second semiconductor element (the second thin film transistor). Their production processes have their respective features.

The fifth aspect of the present invention is a process for producing a semiconductor device, said process comprising a first step of forming a first semiconductor layer and a second semiconductor layer on an insulating surface, a second step of forming a gate insulating film adjacent to said first semiconductor layer and said second semiconductor layer, a third step of forming a first gate electrode adjacent to said gate insulating film, a fourth step of forming a first impurity region by adding an element belonging to Group 15 to said first semiconductor layer and said second semiconductor layer by using said first gate electrode as a mask, a fifth step of forming a second gate electrode which covers said first gate electrode and is in contact with said gate insulating film, a sixth step of forming a second impurity region by adding an element belonging to Group 15 to said first semiconductor layer and said second semiconductor layer by using said second gate electrode as a mask, and a seventh step of removing only the second electrode formed on said second semiconductor layer, with said gate insulating film interposed between them.

The sixth aspect of the present invention is a process for producing a semiconductor device, said process comprising a first step of forming a first semiconductor layer and a second semiconductor layer on an insulating surface, a second step of forming a gate insulating film adjacent to said first semiconductor layer and said second semiconductor layer, a third step of forming a first gate electrode adjacent to said gate insulating film, a fourth step of forming a first impurity region by adding an element belonging to Group 15 to said first semiconductor layer and said second semiconductor layer by using said first gate electrode as a mask, a fifth step of forming a second gate electrode which covers said first gate electrode and is in contact with said gate insulating film, a sixth step of forming a second impurity region by adding an element belonging to Group 15 to said first semiconductor layer and said second semiconductor layer by using said second gate electrode as a mask, a seventh step of removing part of said second electrode, and an eighth step of removing only the second electrode formed on said second semiconductor layer, with said gate insulating film interposed between them.

The foregoing process is characterized in that said first impurity region has the LDD region formed therein and second impurity region has the source region and drain region formed therein.

The foregoing process is characterized in that said first impurity region contains an impurity element of Group 15 in an amount of $1 \times 10^{16}$ to $1 \times 10^{19}$ atms/cm$^3$.

In the meantime, the term "impurity" as used in this specification denotes elements belonging to Groups 13 or 15 of the periodic table, unless otherwise mentioned. The impurity regions may vary in its size (area) during the manufacturing process; however, they will be indicated by the same reference number in this specification unless they change in concentration even though they change in area.

BRIEF DESCRIPTION OF THE DRAWINGS

FIG. 2 is a sectional view showing the process of fabricating a TFT.

FIG. 3 is a sectional view showing the process of fabricating a TFT.
(Embodiment 1)

(Embodiment 1)

Figure 5:
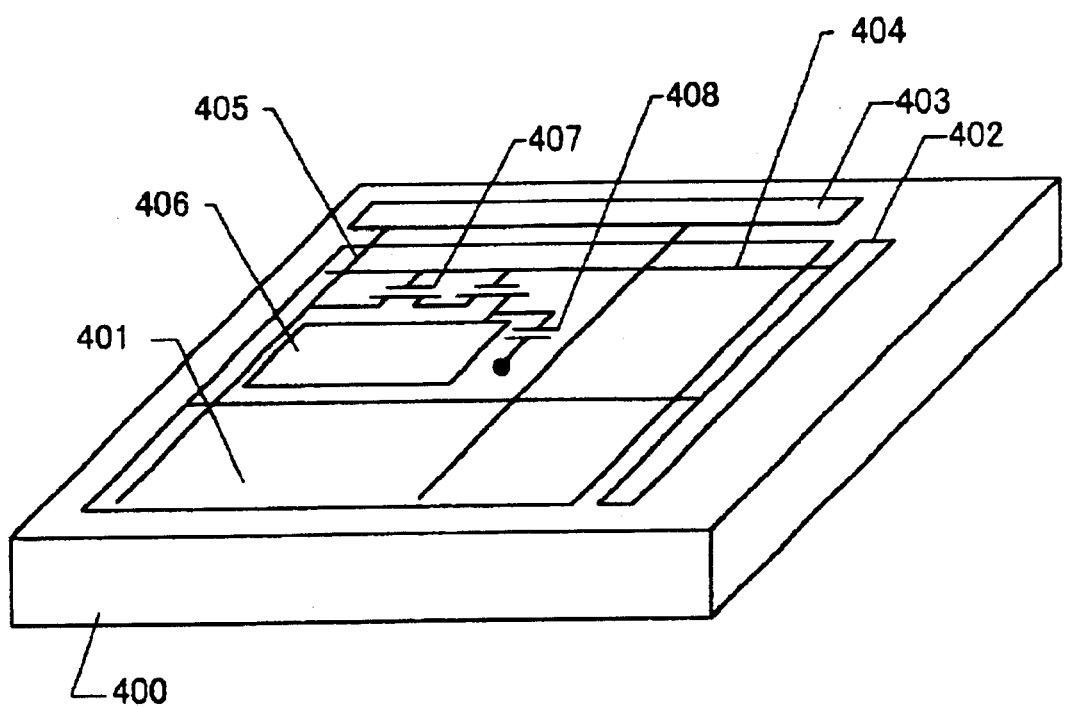

FIG. 5 is a perspective view of an active matrix substrate.

FIG. 6 is a top view of the pixel and the CMOS circuit.

FIG. 7 is a diagram showing the process of fabricating crystalline silicon film.

Figure 8A:
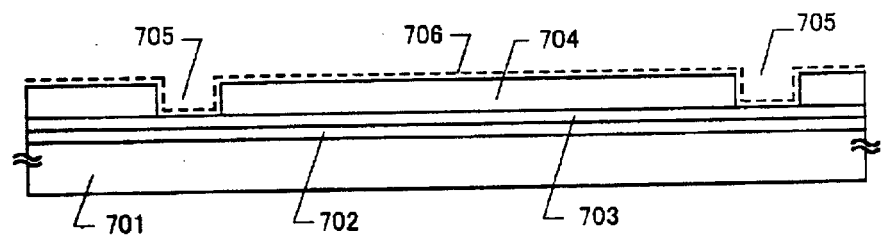
Figure 8B:
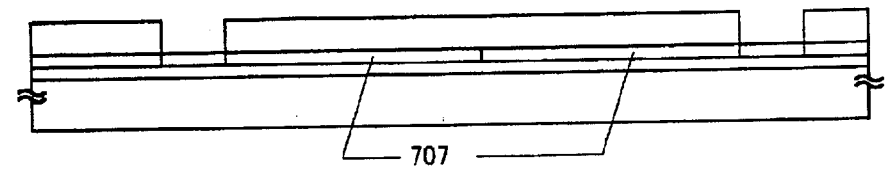

FIG. 8 is a diagram showing the process of fabricating crystalline silicon film.

Figure 9A:
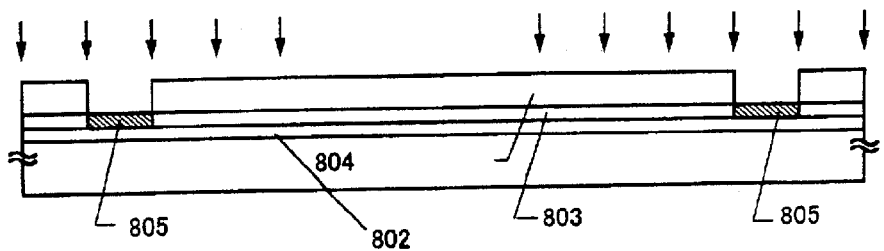
Figure 9B:
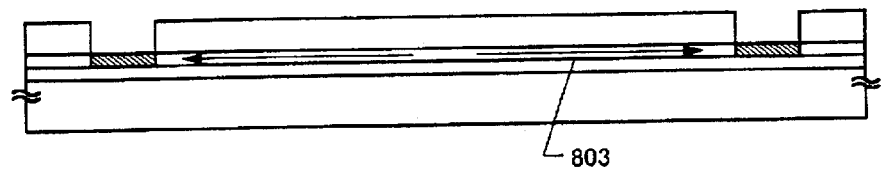

FIG. 9 is a diagram showing the process of fabricating crystalline silicon film.

Figure 10A:
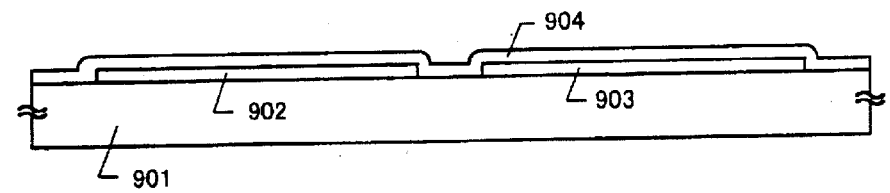
Figure 10B:
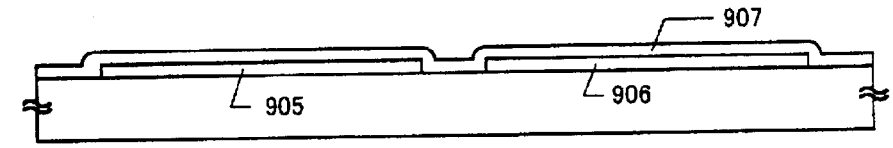

FIG. 10 is a diagram showing the process of fabricating crystalline silicon film.

Figure 11:
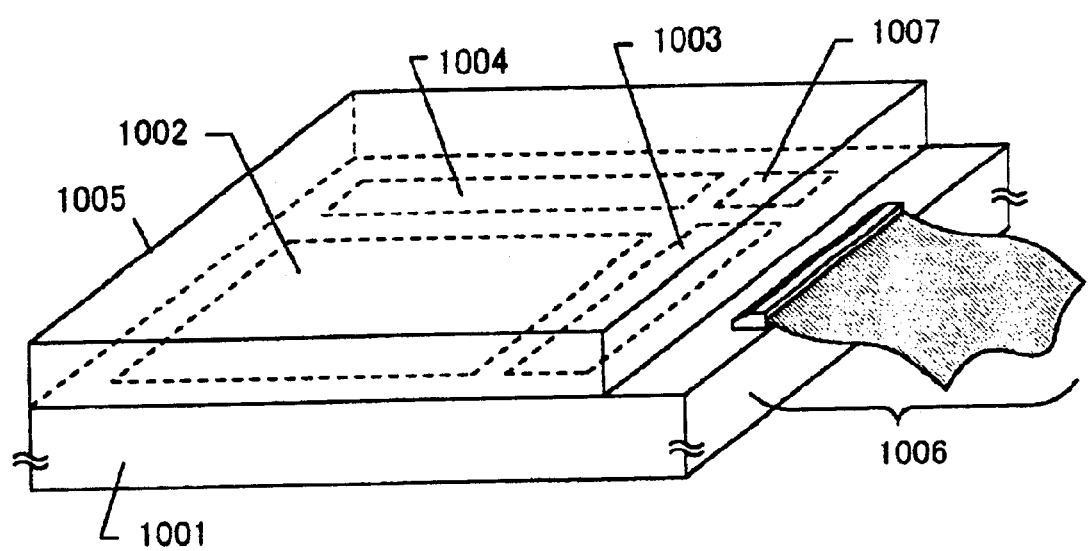

FIG. 11 is a diagram showing the external appearance of a liquid crystal display unit.

FIG. 12 is a diagram showing examples of electronic machines and equipment.

FIG. 13 is a sectional view showing the process of fabricating a TFT.

Figure 14A:
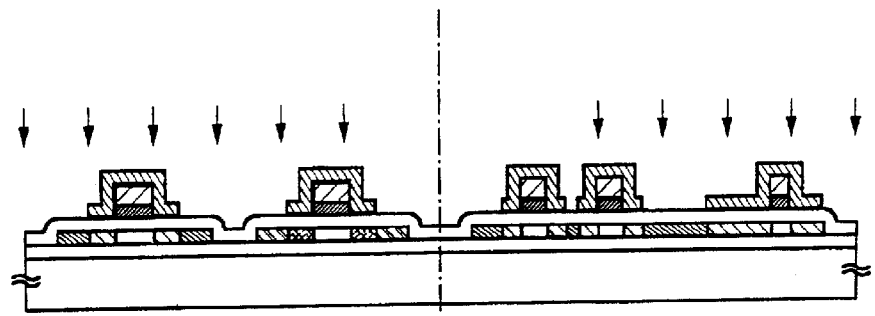
Figure 14B:
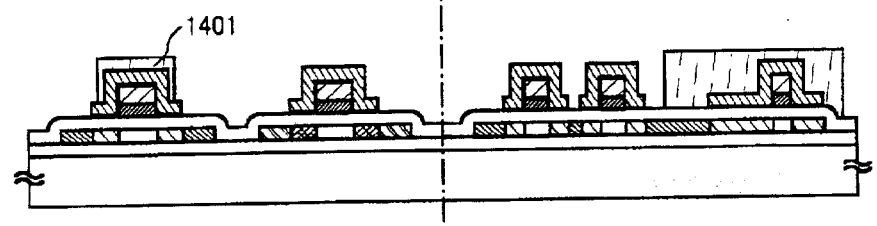
Figure 14C:
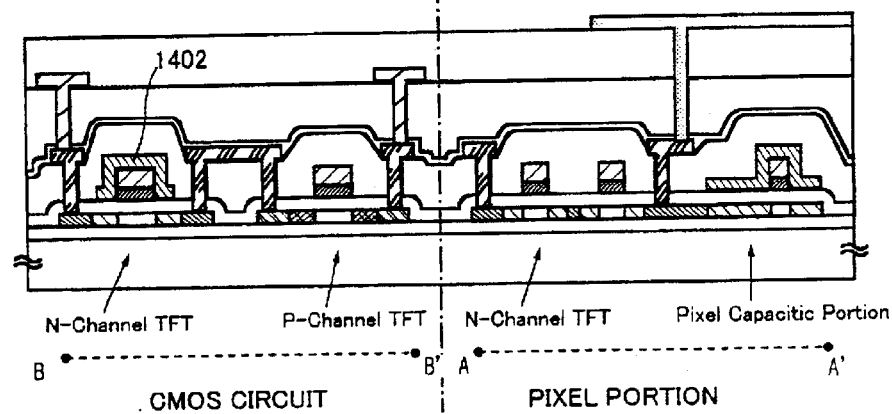

FIG. 14 is a sectional view showing the process of fabricating a TFT.

Figure 15:
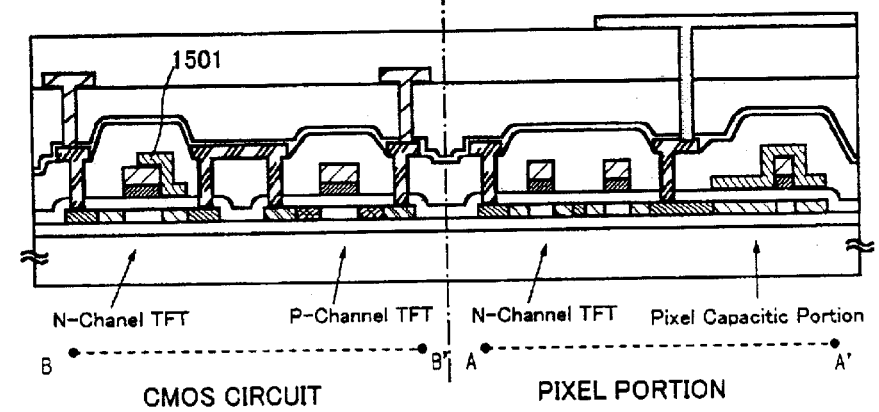

FIG. 15 is a sectional view showing the process of fabricating a TFT.

FIG. 16 is a sectional view showing the process of fabricating a TFT.

FIG. 17 is a diagram showing an example of the structure of the gate electrode of the first TFT.

FIG. 18 is a diagram showing examples of electronic machines and equipment.

Figure 19A:
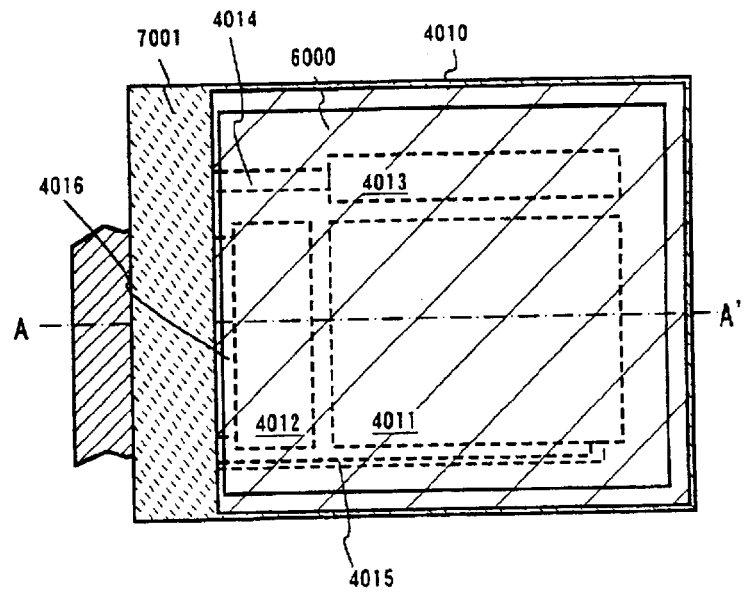
Figure 19B:
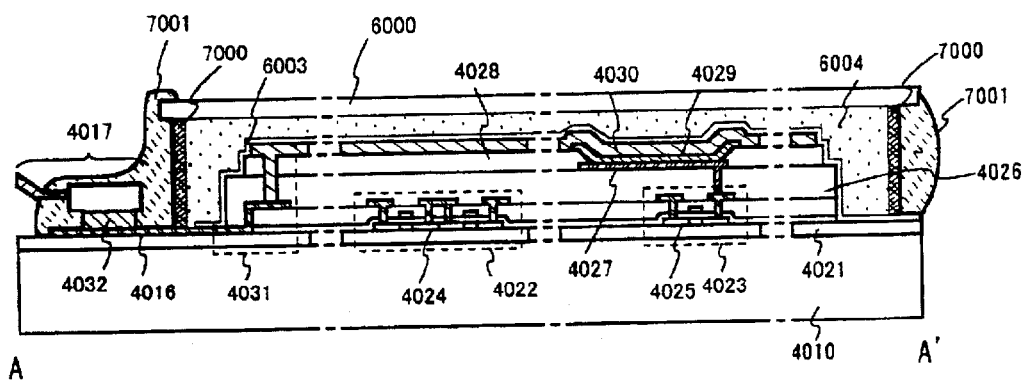
Figure 20A:
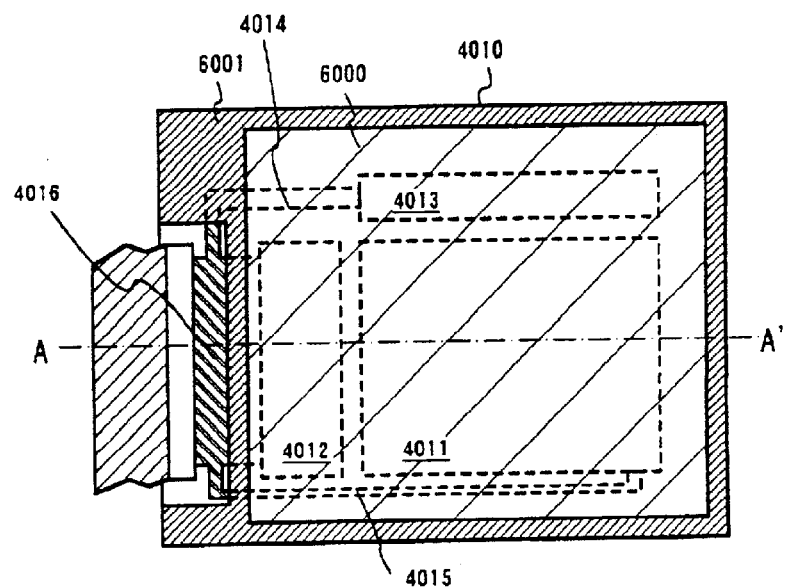
Figure 20B:
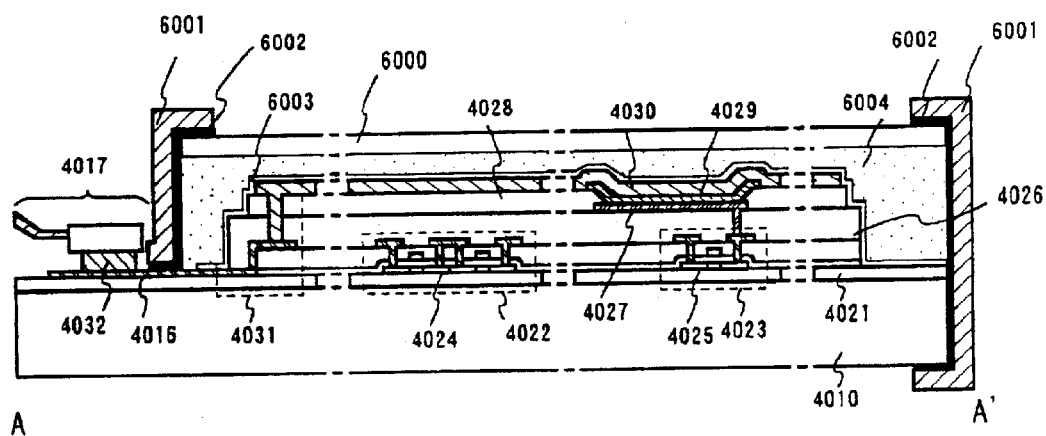
Figure 21:
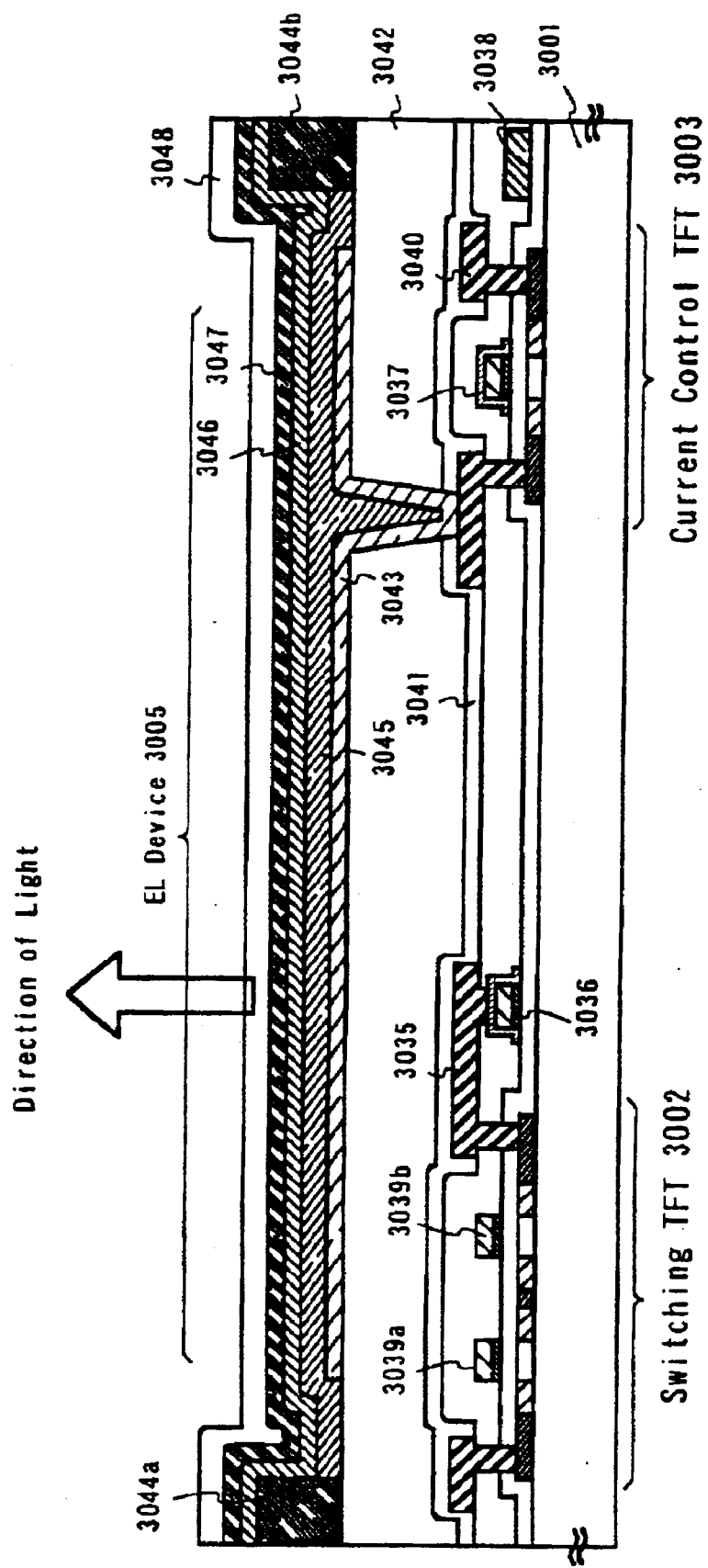
Figure 22A:
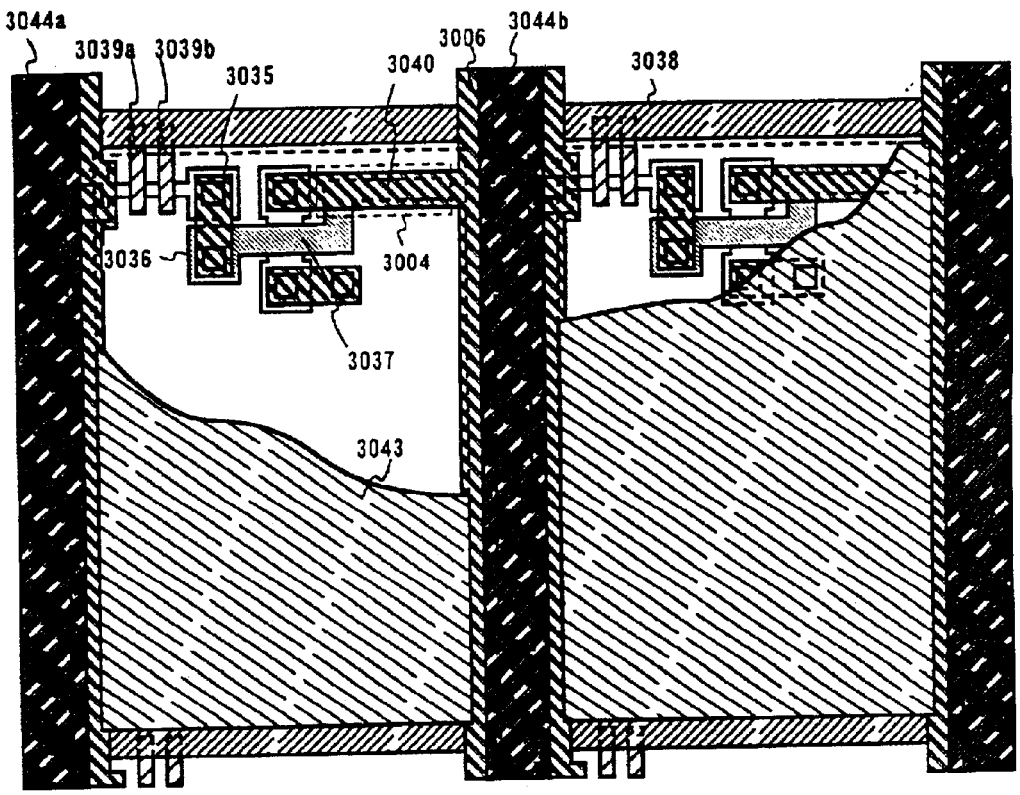
Figure 22B:
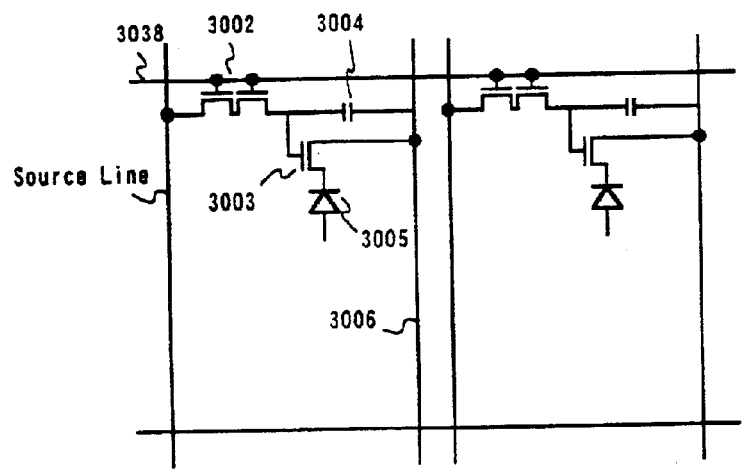
Figure 23:
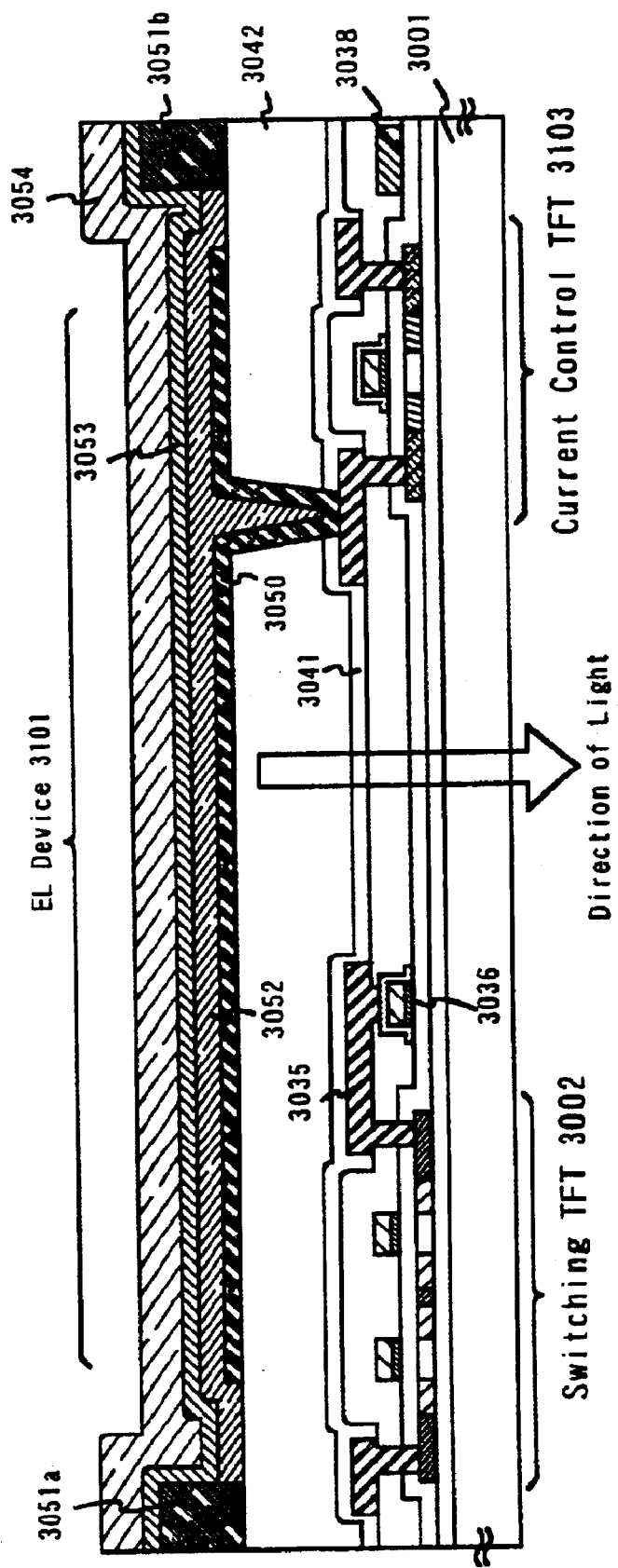
Figure 24A:
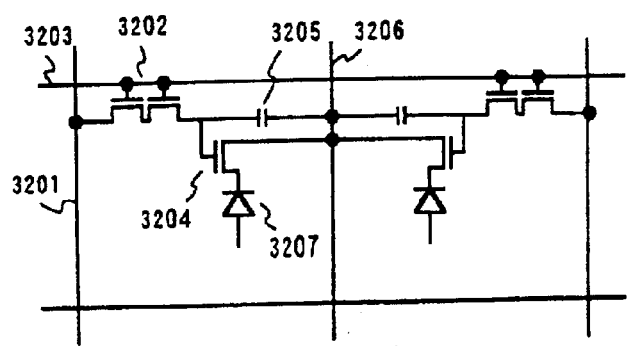

FIG. 19A is a top-view showing the structure of an active matrix EL display device, and FIG. 19B is a cross-sectional view showing thereof;

FIG. 20A is a top-view showing the structure of an active matrix EL display device, and FIG. 20B is a cross-sectional view showing thereof;

FIG. 21 is a view showing the structure of a pixel portion in an active matrix EL display device;

FIG. 22A is a top-view showing the structure of a pixel portion in an active matrix EL display device, and FIG. 22B is a circuit pattern thereof;

FIG. 23 is a view showing the structure of a pixel portion in an active matrix EL display device;

FIG. 24 is circuit patterns in an active matrix EL display device.

DESCRIPTION OF THE PREFERRED EMBODIMENTS

The embodiments of the present invention will be described in more detail with reference to FIGS. 1 and 2. An n-channel type TFT (NTFT for short hereinafter) is illustrated in the following description.

Figure 1A:
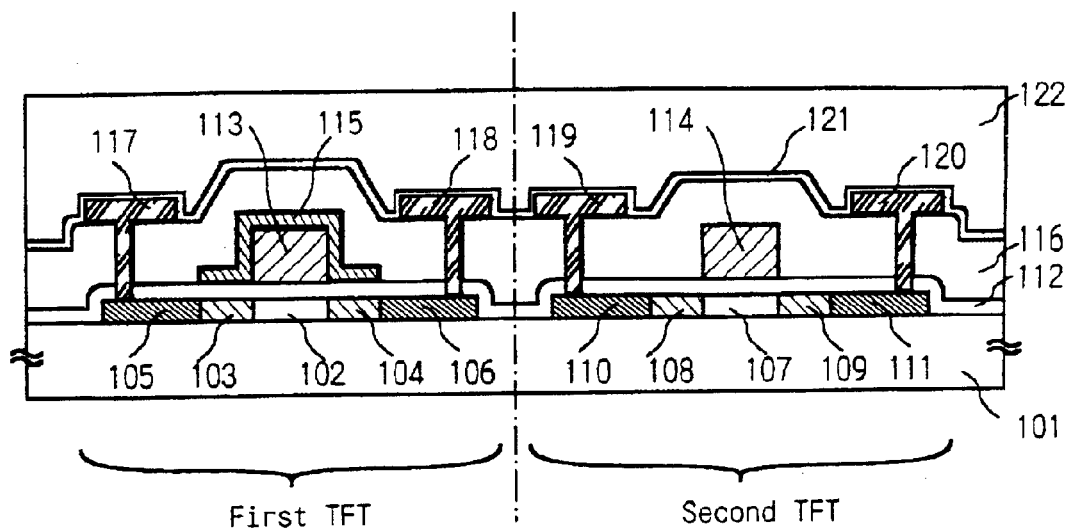
FIG. 1 is a sectional view of a TFr according to one embodiment of the present invention.

FIG. 1(A) shows the fundamental sectional structure of the semiconductor device (top gate type TFT) of the present invention. The semiconductor device is composed of a first NTFT and a second NTFT which are formed on the same substrate, said first NTFT having the first impurity regions 103 and 104 (so-called LDD region) which overlap with the gate electrode 115, with the gate insulating film 112 interposed between them, and said second NTFT having the LDD regions 108 and 109 which do not overlap with the third gate electrode 114, with the gate insulating film 112 interposed between them.

The first NTFT is constructed such that the low concentration impurity regions 103 and 104, which function as the LDD region, overlap with the gate electrode, with the gate insulating film interposed between them. This structure permits sufficient on-current to be secured and offers the advantage like the GOLD structure and LATID structure of MOS transistors. This structure provides a large on-current for improvement in drive performance particularly in the case where the high-speed drive circuit is constructed of the first NTFT.

Figure 1B:
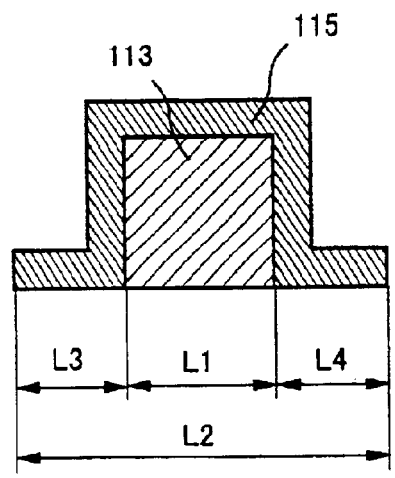

The first NTFT is constructed such that the second gate electrode 115 electrically communicates with the first gate electrode. In addition, the second gate electrode completely overlaps with the first gate electrode, and it extends to the gate insulating film 112. FIG. 1(B) is an enlarged view of the gate electrode of the first NTFT. As shown in FIG. 1(B), the first gate electrode and the second gate electrode should be formed such that the length (L1) of the former is smaller than the length (L2) of the latter. Their lengths may be established adequately. However, in establishing their lengths, it is necessary to take into account that the first gate electrode and the second gate electrode function as a mask when the source-drain region and the LDD region are formed by adding an impurity to the semiconductor layer, as mentioned later. To be concrete, L1 should preferably be 0.1–10 $\mu$m (typically 0.2–5 $\mu$m), and L2 should preferably be 0.3–14 $\mu$m (typically 0.8–8 $\mu$m).

The semiconductor layer of the first NTFT is composed of the channel region 102, the first impurity regions 103 and 104 formed adjacent to both sides of the channel region 102, the source region 105 formed adjacent to the first impurity region 103, and the drain region 106 formed adjacent to the first impurity region 104. The first impurity regions 103 and 104 overlap with the region in which the second electrode 115 is in contact with the gate insulating film, with the gate insulating film 112 interposed between them.

The first impurity regions 103 and 104 are 0.1–2 $\mu$m long, typically 1.5 $\mu$m long, and contain an impurity element (to impart the n-type) in an amount of $1\times10^{16}$–$1\times10^{19}$ atms/cm$^3$, typically $1\times10^{17}$–$5\times10^{18}$ atms/cm$^3$. The source region 105 and drain region 106 contain an impurity element in an amount of $1\times10^{19}$–$1\times10^{21}$ atms/cm$^3$, typically $1\times10^{20}$–$5\times10^{20}$ atms/cm$^3$.

The channel-forming region 102 may be given previously boron in an amount of $1\times10^{16}$–$5\times10^{18}$ atms/cm$^3$. Boron is added to control the threshold voltage, and hence it may be replaced by any other element so long as the same effect is produced.

The second NTFT is constructed such that the low concentration impurity regions 108 and 109 (which become the LDD structure) do not overlap with the third gate electrode 114, with the gate insulating film 112 interposed between them. The part of the low concentration impurity regions 108 and 109 functions substantially as the resistor.

The second NTFT is constructed such that the first low concentration impurity regions 108 and 109 (which function as the LDD regions) do not overlap with the first gate electrode, with the gate insulating film interposed between them. Therefore, it advantageously suppresses the off-current (leakage current) although it lowers the on-current (drive current). It is important that the switching element to drive the pixel electrode should hold the signal charge given to the pixel electrode for a certain period of time. Therefore, in the case where the switching element to drive the pixel electrode is constructed of the second NTFT, it is possible to severely suppress the off-current.

The above-mentioned structure of the present invention can be obtained by the following steps illustrated in FIG. 2. FIG. 1(A) corresponds to FIG. 2(E).

First, the substrate 101 is made ready. The substrate 101 is a substrate having an insulating surface. It may be a glass substrate, quartz substrate, stainless steel substrate, metal substrate, plastics substrate, ceramics substrate, or silicon substrate, each having, for example, silicon oxide film.

Then, an underlying insulating film (not shown) is formed. The underlying film is silicon nitride film, silicon oxide film, or silicon nitride oxide film, in the form of single layer or multiple layers. The underlying film may be formed by plasma CVD, thermal CVD, or sputtering. The silicon nitride film may be incorporated with boron to improve the heat radiation effect. This underlying film is not necessarily essential because it is merely intended to improve the electrical properties of TFT.

Then, the semiconductor film is formed on the underlying film by plasma CVD, reduced pressure CVD, and sputtering. Incidentally, the semiconductor film that can be used in the present invention includes not only those of silicon, germanium, or silicon-germanium but also those of gallium arsenide and other compound semiconductors. The present invention may be applied to TFTs in which the active layer is made of amorphous semiconductor (such as amorphous silicon) and also to TFTs which are made of crystalline semiconductor (including single-crystalline semiconductor film, polycrystalline semiconductor film, and microcrystalline semiconductor film).

Then, the aforesaid semiconductor film undergoes crystallization treatment by any known method, such as heating, irradiation with infrared rays or ultraviolet rays (referred to as laser crystallization hereinafter), catalyzing, and laser crystallization in combination with catalyst. These methods may be used in combination with one another.

The thus formed crystalline silicon film is patterned to give an island-like silicon layer which serves as the active layers 201 and 202.

Then, the gate insulating film 112, which covers the active layers 201 and 202, is formed. The gate insulating film may be silicon nitride film, silicon oxide film, or silicon nitride oxide film, in the form of single layer or multiple layers. The gate insulating film may be formed by plasma CVD, thermal CVD, or sputtering.

Then, the first gate wirings (including a first gate electrode 113 and a third gate electrode 114) are formed on the gate insulating film 112. (FIG. 2(A)) The first gate electrode 113 and the third gate electrode 114 may be formed from tantalum (Ta), tantalum nitride (TaN), titanium (Ti), chromium (Cr), tungsten (W), molybdenum (Mo), silicon (Si), aluminum (Al), or copper (Cu) as simple substance or alloy thereof, in the form of single layer or multiple layers. In the case of copper film, it should be enclosed with silicon nitride film so as to prevent the diffusion of copper.

The multiple-layer structure may be a combination of different metals, such as Ta/Al, Ta/Ti, Cu/W, Al/W, and W/Mo, or a combination of silicon and metal silicide (such as Si/WSi$_x$, Si/TiSi$_x$, and Si/CoSi$_x$).

Then, an impurity element is added to impart the first n-type to the active layers 201 and 202, using the first gate wiring as a mask. In this way the first impurity regions 203–206 are formed. (FIG. 2(B)) The impurity element to impart the n-type to the semiconductor material includes phosphorus (P), arsenic (As), and antimony (Sb). An example that employs phosphorus is explained here. The addition of the impurity element may be accomplished by plasma doping or ion implantation. This step is carried out such that phosphorus is added to the underlying active layer through the gate insulating film 112. Therefore, the doping conditions (dose and accelerating voltage) should be adequately established, with the thickness of gate insulating film taken into consideration. The thus formed impurity region is used to form the first impurity regions 103, 104, 108, and 109 of the n-channel type TFT (explained later), which function as the LDD region. Therefore, the concentration of phosphorus in the first impurity region should preferably be $1\times10^{16}$–$1\times10^{19}$ atms/cm$^3$. After this doping, an intrinsic crystalline silicon layer remains just under the first and third gate electrodes 113 and 114, and the channel-forming regions 102 and 107 are formed. In actual, however, a small portion of the dopant is added to the inside of the gate electrode.

Then, the conducting film, 100–1000 nm thick, is formed such that it covers the first and third gate electrodes 113 and 114. The conducting film undergoes patterning by any known method. Thus, the second gate wirings 115 and 207 are formed. Since the second gate wiring alone should be selectively removed in the subsequent step, it is desirable to make the second gate wiring from a material which is different from that used for the first gate wiring, preferably from a conducting material whose etching selectivity is higher than the material for the first gate wiring. For example, in the case where the first gate wiring is made from tantalum (Ta), the second gate wiring should be made from aluminum (Al), titanium (Ti), chromium (Cr), tungsten (W), or molybdenum (Mo).

Then, an impurity element is added to impart the second n-type to the active layer, using the second gate wirings 115 and 207 as a mask. In this way the second impurity regions 105, 106, 110, and 111 are formed. (FIG. 2(C)) The concentration of phosphorus in the region should preferably be $1\times10^{19}$–$1\times10^{21}$ atms/cm$^3$, so that the second impurity regions function as the source region or drain region.

The example mentioned here illustrates the addition of an impurity to the underlying active layer through the gate insulating film 112. However, it is possible to employs an alternative procedure, in which the gate insulating film covering the source region and drain region is removed so that the semiconductor layer in that region is exposed, and an impurity element is added directly. The advantage of this alternative procedure is that phosphorus can be added efficiently at a low accelerating voltage of ion doping. Other methods of addition include coating with a solution containing an impurity element or forming a film containing an impurity element.

Then, the first NTFT is covered with a mask, and only the second gate wiring in the second NTFT is selectively removed. (FIG. 2(D)) It is important to remove only the second gate electrode, while leaving the third gate electrode, by dry etching or wet etching, in consideration of the material of the first gate electrode, the material of the second gate electrode, and the material of the gate insulating film. Incidentally, in the first gate wiring, the gate electrode of the second NTFT is referred to as the third gate electrode.

Now, the NTFT is completed. The first interlayer insulating film 116 is covered, and the source electrodes 117 and 119 (which communicate with the source regions 105 and 110) and the drain electrodes 118 and 120 (which communicate with the drain regions 106 and 111) are formed. In the case of the structure shown in FIG. 2(E), this step is followed by the step of forming a silicon nitride film as the passivation film 121. Further, the second interlayer insulating film 122 is formed from a resin material. Although any other material than resin material may be used, it is desirable to use a resin material to ensure the surface flatness if the resulting semiconductor device is intended for liquid crystal display units.

In the foregoing, the present invention was explained with reference to NTFT; however, the present invention may be applied also to the p-channel type TFT (PTFT for short hereinafter). In this case, the impurity element to impart the n-type is replaced by the one which imparts the p-type. Such an impurity element is selected from Group 13, and it is typically boron.

The invention will be described in more detail with reference to the following examples.

Embodiment 1

This embodiment demonstrates the application of the present invention to liquid crystal display units. The process in this embodiment is designed to produce the pixel and the CMOS circuit (as the drive circuit) as shown in FIGS. 3 and 4.

The substrate 301 was prepared from alkali-free glass typified by 1737 glass from Corning Glass Works. An underlying film 302 of silicon oxide (200 nm thick) was formed on the surface of the substrate 301 on which TFT was to be formed. The underlying film 302 may optionally be coated with silicon nitride film.

On the underlying film 302 was formed an amorphous silicon film (50 nm thick) by plasma CVD. The amorphous silicon film was heated (preferably at 400–500° C. depending on its hydrogen content) for dehydrogenation so that the hydrogen content was reduced to 5 atomic % or less. The amorphous silicon film was converted into crystalline silicon film by crystallization.

The process for crystallization may be accomplished by any known laser crystallization or thermal crystallization. In this embodiment, the amorphous silicon film was irradiated with a concentrated KrF excimer laser beam of pulse oscillation type. Thus there was obtained the crystalline silicon film.

Incidentally, although the amorphous silicon film was used as the starting film in this embodiment, it may be replaced by a microcrystalline silicon film or it is possible to grow a crystalline silicon film directly.

The crystalline silicon film formed in this way was patterned so as to form island-like semiconductor layers 303, 304, and 305.

Then, the semiconductor layers 303, 304, and 305 were covered with the gate insulating film 306 composed mainly of silicon oxide or silicon nitride. (In this embodiment, the gate insulating film is a silicon nitride oxide film, 100 nm thick, formed by plasma CVD.) On the gate insulating film 306 was formed the first gate wiring comprising the first gate electrode and the third gate electrode (which is not shown in the figure). The first conducting film of tantalum nitride (TaN) 10–200 nm thick (for example, 50 nm thick) and the second conducting film of tantalum (Ta) 100–1000 nm thick (for example, 200 nm thick) were formed sequentially by sputtering. After patterning by any known method, there were obtained the first conducting films 307, 308, 309, and 310 and the second conducting films 312, 313, 314, and 315, constituting the first gate electrode and the third gate electrode. The patterning was accomplished in such a way that the length (L1) of the first gate electrode was 2 μm as shown in FIG. 1(B).

The structure shown in FIG. 3 is such that the pixel capacitive part is formed at the drain side of the n-channel type TFT constituting the pixel. The wiring electrodes 311 and 316 of the pixel capacitive part are formed from the same material as for the first and third gate electrodes.

Thus the structure as shown in FIG. 3(A) was formed. Then the first step of doping an n-type impurity was carried out. Among known impurity elements to impart the n-type to the crystalline semiconductor material are phosphorus (P), arsenic (As), and antimony (Sb). In this embodiment, ion doping with phosphine (PH$_3$) was employed. The accelerating voltage was set rather high at 80 keV so that phosphorus was added to the underlying semiconductor layer through the gate insulating film 306. The impurity region formed in this way forms the first impurity regions 334 and 342 of the n-channel type TFT (explained later) and functions as the LDD region. The concentration of phosphorus in this region should preferably be in the range of $1\times10^{16}$–$1\times10^{19}$ atms/cm$^3$. In this embodiment, it was $1\times10^{18}$ atms/cm$^3$.

In this step, the first conducting films 307–310 and the second conducting films 312–315 constituting the first and third gate electrodes functioned as a mask for the doping of phosphorus. As the result, part of the semiconductor layer under the gate insulating film was not doped with phosphorus completely or almost completely. (This part is the region just under the first gate electrode.) Thus there were formed the phosphorus-doped low-concentration impurity regions 317–323, as shown in FIG. 3(B).

Incidentally, the low-concentration impurity region 323 formed in this step functions later as the lower electrode of the pixel capacitive part. In this embodiment, the semiconductor layer with lightly doped phosphorus is used as the lower electrode; therefore, it is possible to secure the desired capacity by application of a comparatively low voltage. In this specification, the electrodes of the pixel capacitive parts are all called capacitive electrodes; however, capacitive electrodes may be referred to as "upper electrodes" or "lower electrodes" when the explanation needs such discrimination.

The region in which the n-channel type TFT was to be formed was covered with the photoresist masks 324 and 325. The region in which the p-channel type TFT was to be formed was doped with an impurity to impart the p-type. Among known impurity elements to impart the p-type are boron (B), aluminum (Al), and gallium (Ga). In this embodiment, ion doping with diborane (B$_2$H$_6$) was employed. The accelerating voltage was set at 80 keV so that the concentration of doped boron was $2\times10^{20}$ atms/cm$^3$. Thus there were formed the regions 326 and 327 to which boron was doped in high concentrations, as shown in FIG. 3(C). These regions function later as the source-drain region of the p-channel type TFT. In this embodiment, the pixel part was covered with the resist mask 325; however, there is an alternative way in which only the region of the n-channel type TFT of the pixel part is covered with a resist mask and the capacitive part of the pixel is highly doped with boron so that the pixel capacity is increased.

It is possible to reverse the order of the step shown in FIG. 3(B) (for doping with an n-type impurity) and the step shown in FIG. 3(C) (for doping with a p-type impurity).

Then, the resist masks 324 and 325 were removed. At this step, the impurity element added to the semiconductor layer was activated by laser annealing or heat treatment. This activation step may be carried out after the step of forming the source-drain region by impurity doping. It is effective to activate the impurity by laser annealing or heat treatment each time when doping is completed. If the step of activation is carried out after the impurity doping to form the source-drain region, the second gate electrode is formed on the impurity region, with the gate insulating film interposed between them, and this presents difficulties in activation by laser annealing. Also, in the case where the second gate electrode is made from a low-melting material (such as aluminum), activation by heat treatment will be difficult to achieve.

Then, the second gate electrode was formed from chromium (Cr), in a thickness ranging from 100 to 1000 nm thick, for example, 200 nm. After patterning by any known method, there were formed the second gate electrodes 328, 329, 330, and 331. The patterning was accomplished in such a way that the length (L2) (shown in FIG. 1(B)) of the second gate electrode was 5 μm. As the result, the second gate electrode has regions (each 1.5 μm long) formed adjacent to both sides of the first gate electrode.

The pixel capacitive part is formed on the drain side of the n-channel type TFT constituting the pixel. The electrode 332 of this pixel capacitive part was formed simultaneously with the second gate electrode.

Using the second gate electrodes 328–331 as a mask, the second doping (ion doping with phosphine ($PH_3$)) was carried out to impart the n-type. (FIG. 3(D)) The accelerating voltage was set rather high at 80 keV so that phosphorus was added to the underlying semiconductor layer through the gate insulating film 306. The regions 335, 336, 343, and 347 doped with phosphorus function as the source region or drain region of the n-channel type TFT. Therefore, the concentration of phosphorus in this region should preferably be $1\times10^{19}$ to $1\times10^{21}$ atms/cm$^3$. In this embodiment, it was $1\times10^{20}$ atms/cm$^3$.

An optional step (not shown here) may be added, which consists of removing the gate insulting film covering the source regions 335, 343, and drain regions 336 and 347, thereby causing the semiconductor layer in this region to be exposed, and adding phosphorus to it directly. This additional step permits the reduction of accelerating voltage for ion doping to 10 keV and also permits efficient phosphorus doping.

Phosphorus was added in the same concentration to both the source region 339 and the drain region 340 of the p-channel type TFT. This step did not reverse the conductivity type because boron in twice the concentration had been added in the previous step. Therefore, this step posed no problem with the action of the p-channel type TFT.

The impurity element as such added to impart the n-type or p-type does not function effectively. It needs activation by thermal annealing in an electric furnace, laser annealing with excimer laser, or rapid thermal annealing (RTA).

In this embodiment, activation was accomplished by heating at 550° C. for 2 hours in a nitrogen atmosphere. In the case where the second gate electrode is made from a low-melting material (such as aluminum), it is desirable to perform activation by heat treatment or laser annealing before the second gate electrode is formed. Better results are produced if laser annealing is followed by thermal annealing. This step also functions to anneal the region in which crystallinity was destroyed by ion doping and hence improves crystallinity in that region.

Then, the second gate electrode was selectively removed for the circuit which greatly needs the suppression of off-current (leakage current). In this embodiment, the region other than the p-channel type TFT of CMOS circuit and the n-channel type TFT for the pixel part was covered with the resist masks 349 and 350, and wet etching was performed to remove the second gate electrodes 330 and 331 of the n-channel type TFT in the pixel part and the second gate electrode 329 of the p-channel type TFT. The etchant for this wet etching was a mixture of hydrochloric acid and water. If the second gate electrode made of a low-resistance material is present in other region than mentioned above, it is easy to drive TFTs (constituting a large panel) with a low electric power. Subsequently, the resist masks 349 and 350 were removed.

The steps mentioned above formed the n-channel type TFT of CMOS circuit to such a stage that the first gate electrode was formed, the second gate electrode covering the first gate electrode was formed, and the source region and drain region were formed on both sides of the second gate electrode, with the gating insulating film interposed between them. The resulting structure is such that the first impurity region (formed in the semiconductor layer, with the gate insulating film interposed between them) overlaps with the region in which the second gate electrode is in contact with the gate insulating film. This structure provides sufficient on-current in the n-channel type TFT of CMOS circuit.

On the other hand, the structure in the n-channel type TFT for the pixel part was such that the first impurity region formed in the semiconductor layer, with the gate insulating film interposed between them, does not overlap with the third gate electrode. This structure sufficiently suppresses the off-current in the n-channel type TFT in the pixel part.

It is desirable to hold balance between the p-channel type TFT and the n-channel type TFT in the CMOS circuit in view of the fact that the p-channel type TFT in the CMOS circuit inherently has high reliability. In other words, it is desirable to adopt the structure in which the second gate electrode is removed. The structure as in this embodiment provides good balance (in electrical properties) between NTFT and PTFT and hence prevents anomalous operation.

After the stage shown in FIG. 3(E), the first interlayer insulating film 351 (1000 nm thick) was formed. It may be silicon oxide film, silicon nitride film, silicon nitride oxide film, organic resin film, or a laminate film thereof. A dual-layer structure (not shown) was employed in this embodiment, which is composed of sequentially formed silicon nitride film (50 nm) and silicon oxide film (950 nm).

The first interlayer insulating film 351 underwent patterning so that contact holes were made in the source region and drain region of the respective TFTs. Then, the source electrodes 352, 354, and 355 and the drain electrodes 353 and 356 were formed. In this embodiment, the electrode was formed by patterning a triple-layer film (not shown) composed of titanium film (100 nm), titanium-containing aluminum film (300 nm), and titanium film (150 nm) which were formed sequentially by sputtering.

Figure 4A:
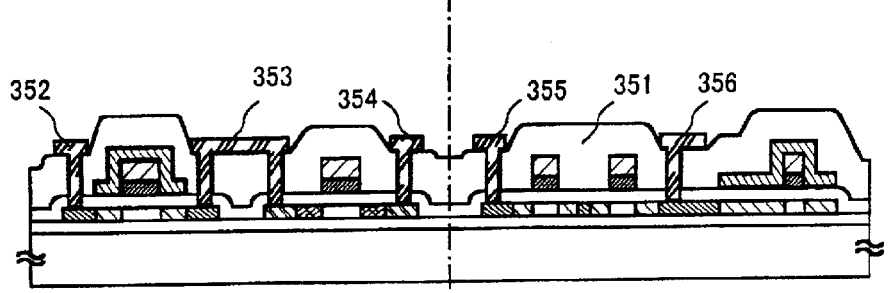
FIG. 4 is a sectional view showing the process of fabricating a TFT.
Figure 4B:
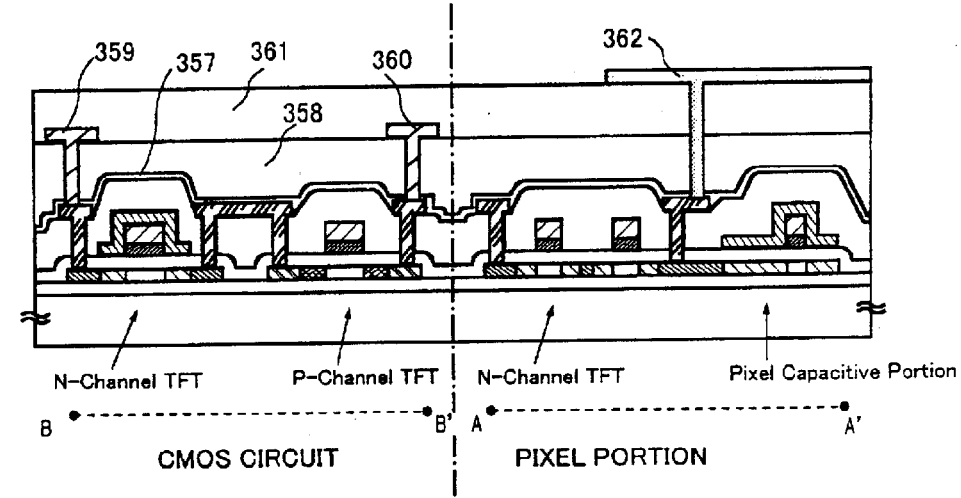

Thus, the CMOS circuit and the pixel part were formed on the substrate 301 as shown in FIG. 4(A). At the same time, the pixel capacitive part was formed on the drain side of the n-channel type TFT of the pixel part.

Then, the passivation film 357 was formed, which covers the source electrodes 352, 354, and 355, the drain electrodes 353 and 356, and the first interlayer insulating film 351. The passivation film 357 is a silicon nitride film (50 nm). Further, the second interlayer insulating film 358 of organic resin was formed (about 1000 nm thick). The organic resin may be polyimide, acrylic, polyimideamide, or the like. The advantage of the organic resin film is that it can be formed in a simple manner, it has a low relative permittivity and hence it has a small parasitic capacity, and it is superior in smoothness. In this embodiment, the organic resin film was formed from polyimide (capable of thermal polymerization after application to the substrate) by baking at 300° C.

Incidentally, it is permissible to form a light-screening layer on a part of the second interlayer insulating film 358 in the pixel region. This layer may be a metal film or an organic resin film containing a pigment.

Then, the third interlayer insulating film 361 was formed. (It may be formed from an organic resin as in the case of the second interlayer insulating film 358.) Contact holes were formed in the second interlayer insulating film 358 and the third interlayer insulating film 361, such that they reach the drain electrode 356. Then, the pixel electrode 362 was formed. It may be a transparent conducting film in the case of transmission-type liquid crystal display unit, or it may be a metal film in the case of reflection-type liquid crystal display unit. In this embodiment (intended for transmission-type liquid crystal display unit), an indium oxide-tin (ITO) film was formed (100 nm thick) by sputtering, which serves as the pixel electrode 362.

The above-mentioned steps gave an active matrix substrate having the pixel part and CMOS circuit formed thereon. FIG. 5 is a perspective view of the active matrix substrate produced in this embodiment. The active matrix substrate is composed of the substrate 400 and the pixel part 401, the scanning line drive circuit 402, and the signal line drive circuit 403 formed thereon. The drive circuit is based on the CMOS circuit. The scanning line (gate line) drive circuit 402 and signal line (source line) drive circuit 403 are connected to the pixel part 401 through the gate wiring 404 and the source wiring 405, respectively. There are shown in FIG. 5 the pixel electrode 406, the pixel TFF 407 of NTFT, and the pixel capacity 408.

Figure 6A:
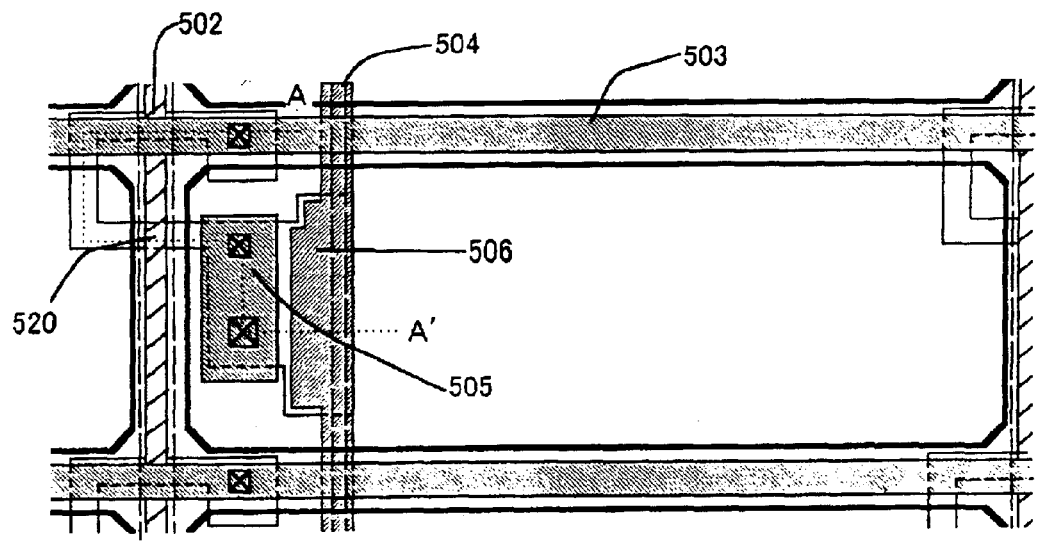

FIG. 6(A) is a top view of the pixel part 401 shown in FIG. 5. This view covers approximately one pixel. The pixel has the n-channel type TFT. The gate electrode 520 communicating with the gate wiring 502 crosses the underlying semiconductor layer, with the gate insulating film interposed between them (not shown). The semiconductor layer has a source region, a drain region, and a first impurity region (not shown) formed thereon. On the drain side of the pixel TFT is the pixel capacity 506 which is composed of the semiconductor layer, the gate insulating film, and the electrode made of the same material as the first and second gate electrodes. The capacitive wiring 504 connected to the pixel capacity 506 is formed parallel to the gate wiring 502. The sectional view taken long the line A–A' in FIG. 6(A) corresponds to the sectional view of the pixel part shown in FIG. 4(B).

Figure 6B:
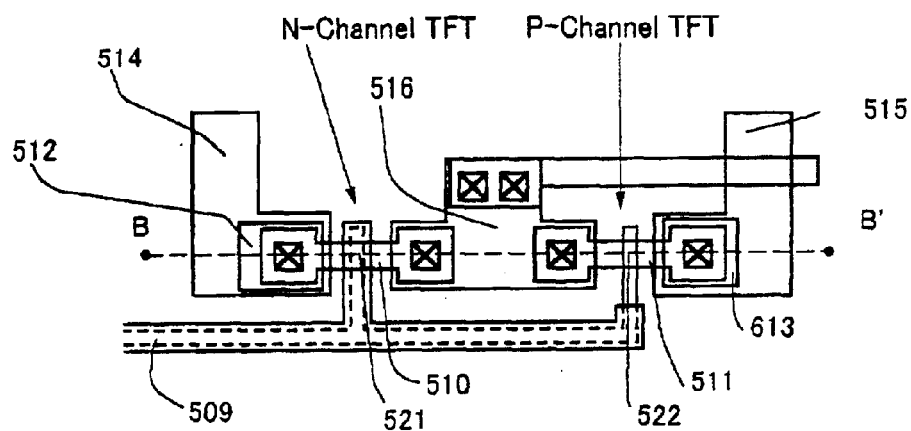

On the other hand, the CMOS circuit shown in FIG. 6(B) is constructed such that the third gate electrode 522 (which extends from the gate wiring 509 in the p-channel type TFT) crosses the underlying semiconductor layer 511, with a gate insulating film (not shown) interposed between them, and the second gate electrode 521, including the first gate electrode, (which extends from the gate wiring 509 in the n-channel type TFT) crosses the underlying semiconductor layer 510, with a gate insulating film (not shown) interposed between them. A source region, a drain region, and a first impurity region are formed in the semiconductor layer of the p-channel type TFT and the n-channel type TFT (although they are not shown). Also, a source region and a drain region are formed in the semiconductor layer of the p-channel type TFT and the n-channel type TFT. Their relative position is shown in the sectional view taken along the line B–B' which corresponds to the sectional view of the CMOS circuit shown in FIG. 4(B).

In this embodiment, the pixel TFT is of double-gate structure; however, it may be of single-gate structure of triple-gate structure. The structure of the active matrix substrate of the present invention is not limited to the one in this embodiment. The structure of the present invention is characterized by the construction of the gate electrode and the construction of the source region, drain region, and other impurity region of the semiconductor layer formed with the gate insulating film interposed between them. Therefore, other construction may be adequately established by those who practice the present invention.

Then, the alignment layer is formed on the active matrix substrate. An opposed substrate having opposed electrodes and an alignment layer (and a black mask, if necessary) is made ready. The two components are placed in position and a liquid crystal material is enclosed between them, so as to give the liquid crystal display unit of active matrix type (liquid crystal module) constructed as shown in FIG. 11. FIG. 11 shows the external appearance of the completed liquid crystal display unit of active matrix type. The substrate 1001 is provided with the pixel part 1002, the signal drive circuit 1003, the scanning light drive circuit 1004, the signal processing circuit 1007, and the FPC wiring 1006. The procedure of enclosing a liquid crystal material may be accomplished in any known way; therefore, its detailed description is omitted here.

Embodiment 2

This embodiment differs from Embodiment 1 in that the crystalline semiconductor film as the semiconductor layer is formed by thermal crystallization with the aid of a catalytic element. This step should preferably be carried out by using the technology disclosed in Japanese Patent Laid-open No. 130652/1995 and 78329/1996.

Figure 7A:
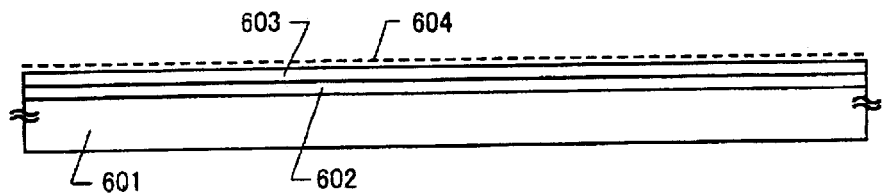
Figure 7B:
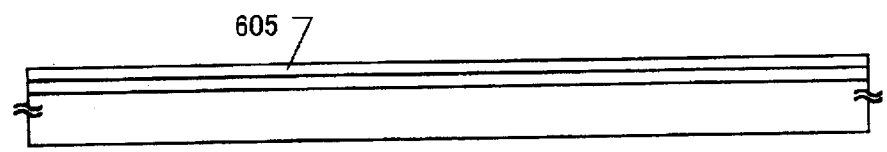

The technology disclosed in Japanese Patent Laid-open No. 130652/1995 was applied to the present invention as shown in FIG. 7. On the silicon substrate 601 was formed sequentially the silicon oxide film 602 and the amorphous silicon film 603. Further, the nickel-containing layer 604 was formed by coating with a nickel acetate solution containing 10 ppm of nickel (by weight). (FIG. 7(A))

Dehydration at 500° C. for 1 hour and heat treatment at 500–650° C. for 4–12 hours (for example, at 550° C. for 8 hours) were carried out so as to form the crystalline silicon film 605. The resulting crystalline silicon film 605 was superior in crystallinity. (FIG. 7(B))

The technology disclosed in Japanese Patent Laid-open No. 78329/1996 permits selective crystallization of the amorphous semiconductor film by selective addition of a catalytic element. It was applied to the present invention as shown in FIG. 8.

On the glass substrate 701 was formed consecutively the silicon oxide film 702, the amorphous silicon film 703, and the silicon oxide film 704. The silicon oxide film 704 was 150 nm thick.

The silicon oxide film 704 was patterned so as to form selectively the opening 705. The nickel-containing layer 706 was formed by application of a nickel acetate solution (containing 10 ppm of nickel by weight). The nickel-containing layer 706 comes into contact with the amorphous silicon film 702 only at the bottom of the opening 705. (FIG. 8(A))

Heat treatment at 500–650° C. for 4–24 hours (for example, 570° C. for 14 hours) was carried out so as to form the crystalline silicon film 707. In the course of crystallization, that part of the amorphous silicon film which is in contact with nickel crystallizes first and the crystallization proceeds in the lateral direction. The thus formed crystalline silicon film 707 is composed of rod-like or needle crystals. Individual crystals grow in a specific direction (macroscopically) and hence they are uniform in crystallinity.

The above-mentioned two technologies may employ, in addition to nickel (Ni), a catalytic element selected from germanium (Ge), iron (Fe), palladium (Pd), tin (Sn), lead (Pb), cobalt (Co), platinum (Pt), copper (Cu), and gold (Au).

The crystalline semiconductor film (including crystalline silicon film and crystalline silicon germanium film) formed by the above-mentioned technologies, followed by patterning, gives the semiconductor layer of TFT. The TFT formed from the crystalline semiconductor film according to the technology of the present invention has good characteristic properties. There has been a demand for high reliability. It has become possible to produce TFT that makes best use of the technology of this embodiment as the result of accepting the TFT structure of the present invention.

Embodiment 3

This embodiment demonstrates the procedure to form the semiconductor layer used in Embodiment 1. In this procedure, an amorphous semiconductor film is formed first and then it is crystallized with the aid of the above-mentioned catalytic element, which is finally removed from the crystalline semiconductor film. The procedure in this embodiment is based on the technology disclosed in Japanese Patent Laid-open No. 135468/1998 and 135469/1998.

This technology is concerned with the removal of the catalytic element (used for crystallization of the amorphous semiconductor film) by gettering after crystallization. This technology makes it possible to reduce the concentration of the catalytic element in the crystalline semiconductor film down to $1 \times 10^{17}$ atms/cm$^3$, preferably $1 \times 10^{16}$ atms/cm$^3$.

This embodiment is explained with reference to FIG. 9. The substrate is alkali-free glass typified by 1737 glass from Corning Glass Works. FIG. 9(A) shows the underlying film 802 and the crystalline silicon film 803 formed by the technology for crystallization explained in Embodiment 2. On the surface of the crystalline silicon film 803 is formed the silicon oxide film 804 (as a mask) which is 150 nm thick. The silicon oxide film 804 has the opening formed by patterning, so that there is the region in which the crystalline silicon film is exposed. The step of doping phosphorus was carried out, and thus the region 805 was formed which is phosphorus-doped crystalline silicon film.

Heat treatment was carried out in a nitrogen atmosphere at 550–800° C. for 5–24 hours (for example, at 600° C. for 12 hours). The region in which the crystalline silicon film had been doped with phosphorus functioned as the gettering site, so that the catalytic element remaining in the crystalline silicon film 803 segregated in the region 805.

The silicon oxide film 804 as a mask and the phosphorus-doped region 805 were removed by etching. Thus it was possible to obtain the crystalline silicon film in which the concentration of the catalytic element used in the step of crystallization was reduced below $1 \times 10^{17}$ atms/cm$^3$. This crystalline silicon film was able to be used as such as the semiconductor layer of the TFT (shown in Embodiment 1) according to the present invention.

The construction in this embodiment may be combined with that in Embodiment 2.

Embodiment 4

This embodiment demonstrates another embodiment of forming the semiconductor layer and gate insulating film in the step shown in Embodiment 3. This embodiment is explained with reference to FIG. 10.

This embodiment employs the quartz substrate 901 because the substrate has to have heat resistance at 700–1100° C. The technology shown in Embodiment 2 or 3 was used to form the crystalline semiconductor. The crystalline semiconductor was patterned to give the island-like semiconductor layers 902 and 903, which function as the semiconductor layer of TFT. The semiconductor layers 902 and 903 were covered with the gate insulating film 904 which is composed mainly of silicon oxide. In this embodiment, a silicon nitride oxide film (70 nm) was formed by plasma CVD. (FIG. 10(A))

Heat treatment was carried out in an atmosphere containing halogen (typically chlorine) and oxygen at 950° C. for 30 minutes. The treating temperature may range from 700 to 1100° C. and the treating time may range from 10 minutes to 8 hours. (FIG. 10(B))

Under the conditions specified in this embodiment, a thermally oxidized film was formed at the interface between the semiconductor layer 902, 903 and the insulating film 904, and the gate insulating film 907 was formed.

The gate insulating film 907 formed by the above-mentioned steps had a high dielectric strength and the interface between the semiconductor layer 905, 906 and the gate insulating film 907 was vary good. The subsequent steps to obtain the structure of TFT according to the present invention are the same as those in Embodiment 1.

Embodiment 5

In this embodiment, the semiconductor layer as shown in Embodiment 1 was formed by the method of thermal crystallization with a catalytic element shown in Embodiment 2, and the catalytic element was removed from the crystalline semiconductor film by the method which is different from that in Embodiment 3. The process is shown in FIG. 13. In this embodiment, the state as shown in FIG. 3(D) was obtained and then heat treatment was carried out so as to remove the catalytic element by the gettering action of phosphorus. The basic steps are the same as those in Embodiments 1 and 2, and only different points are explained. Incidentally, FIG. 13(A) is equivalent to FIG. 3(D). For the sake of brevity, the same reference numbers are used in these figures.

The crystalline silicon film obtained by the method in Embodiment 2 was used as the semiconductor layer 303–305. According to the procedure in Embodiment 1, the state shown in FIG. 3(D) was obtained. (FIG. 13(A)) The concentration of phosphorus to be added to the impurity regions 335, 336, 339, 340, 343, 344, and 347 should preferably be $1 \times 10^{19}$–$1 \times 10^{21}$ atms/cm$^3$. In this embodiment, it is $1 \times 10^{20}$ atms/cm$^3$.

After doping with phosphorus, heat treatment was carried out in a nitrogen atmosphere at 500–800° C. for 1–24 hours (for example, at 600° C. for 12 hours). (FIG. 13(B)) This step activated the impurity element added to impart the n-type and p-type. The impurity regions 335, 336, 339, 340, 343, 344, and 347 doped with phosphorus functioned as the gettering site, resulting in segregation of the catalytic element remaining after crystallization. As the result, the catalytic element was removed from the channel region and the concentration of the catalytic element was reduced below $1 \times 10^{17}$ atms/cm$^3$.

After the step shown in FIG. 13(B) was completed, the second gate electrode is removed selectively (FIG. 13(C)). Then, the same steps as in Embodiment 1 were repeated to give the active matrix substrate.

The structure in this embodiment may be combined with any of the structure in Embodiments 1 to 4.

Embodiment 6

This embodiment demonstrates the removing of the second electrode in a desired region by using a resist mask differing in pattern from that in Embodiment 1. Incidentally, FIG. 14(A) corresponds to FIG. 3(D).

The state as shown in FIG. 3(D) was obtained by the step of Embodiment 1. (FIG. 14(A)) The resist mask 1401 for NTFT of CMOS circuit was formed on the second gate wiring. (FIG. 14(B)) In the pixel capacitive part, the resist mask of the same shape as in Embodiment 1 was formed simultaneously.

Etching was carried out in the same way as in Embodiment 1 so as to partly remove the second gate electrode of PTFT in CMOS circuit, the second gate electrode of NTFT in the pixel part, and the second gate electrode of NTFT in CMOS circuit. Thus the state shown in FIG. 14(C) was obtained. The resist mask 1401 was adequately controlled so as to adjust the region in which the second gate electrode overlaps with the first impurity region. This reduces off-current and secures sufficient on-current. Incidentally, the end of the second gate electrode 1402 does not coincide with the boundary between the first impurity region and the second impurity region.

In this embodiment, it is possible to change the shape of the resist mask 1401 as desired. For example, as shown in FIG. 15, the second gate electrode 1501 is left only in the side of the drain region of NTFT of CMOS circuit.

The structure in this embodiment may be combined with any of the structure in Embodiments 1 to 5.

Embodiment 7

In this embodiment, the second electrode was partly removed by the method differing from that in Embodiment 6, as shown in FIG. 16.

The state as shown in FIG. 3(C) was obtained by the step of Embodiment 1.

The second gate electrode is formed according to Embodiment 1. In this embodiment, the n-type impurity region was formed while leaving the resist mask 1601 used to form the gate electrode. (FIG. 16(A))

Isotropic etching was carried out using the resist mask 1601 as a mask, so that the exposed gate electrode was partly removed. Etching may be accomplished by either wet etching with a solution or dry etching with a gas. This etching forms the second gate electrode which has its end retreated by 0.5 μm. As the result of this step, the line width corresponding to L2 in FIG. 1(B) became 0.3–14 μm, typically 0.8–8 μm. (FIG. 16(B))

The resist mask 1601 was removed, and then the resist mask 1602 was formed again. Only the second gate electrode was removed by etching in the same way as in Embodiment 1. (FIG. 16(C))

Figure 16A:
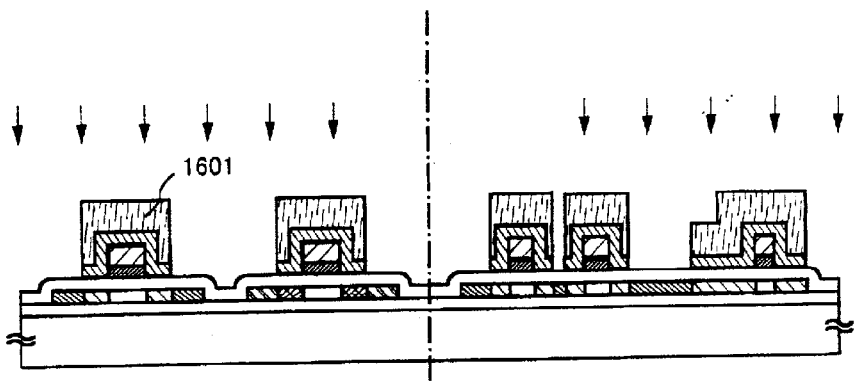
Figure 16B:
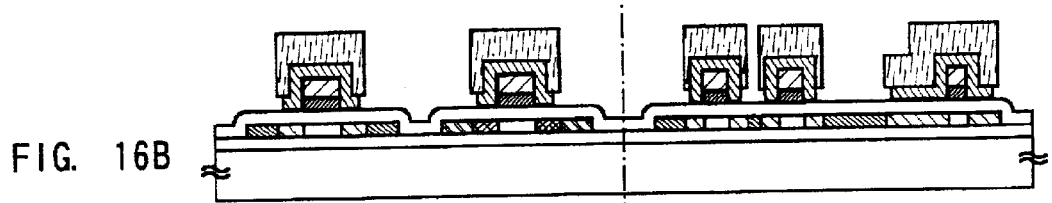
Figure 16C:
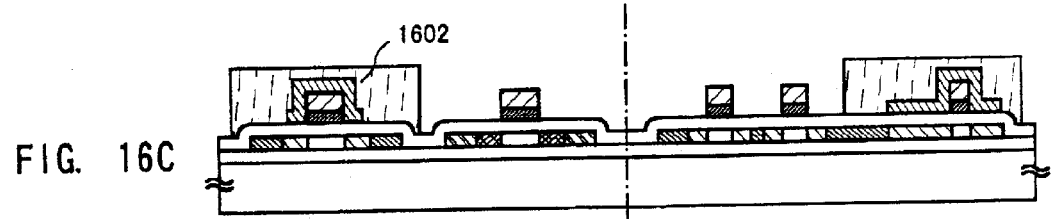
Figure 16D:
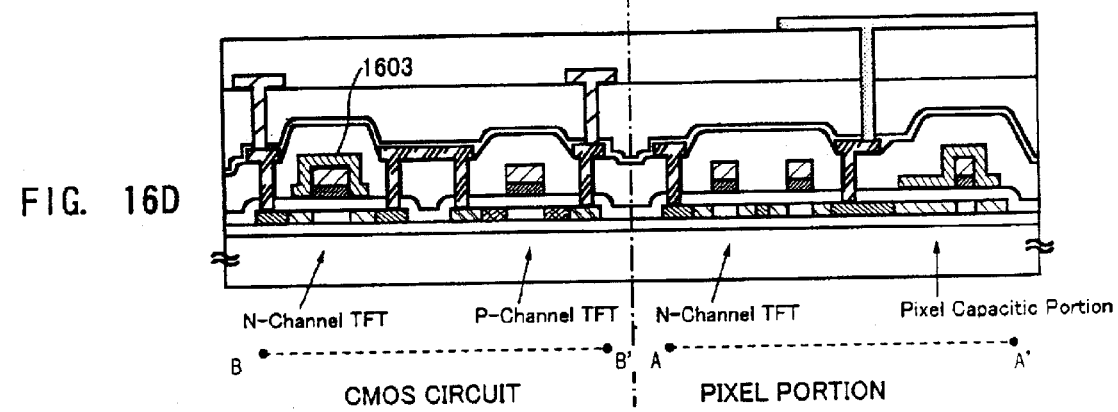

Subsequently, the same steps as in Embodiment 1 were repeated to give the structure as shown in FIG. 16(C).

In this way there was formed the LDD region of the n-channel type TFT which corresponds to the part close to the channel forming region that overlaps with the second gate electrode 1603 and the region that does not overlap with the second gate electrode.

As in Embodiment 6, the embodiment makes it possible to control adequately the resist mask 1601, thereby adjusting the region in which the second gate electrode overlaps with the first impurity region, so that off-current is reduced and sufficient on-current is secured.

The structure in this embodiment may be combined with any of the structure in Embodiments 1 to 5.

Embodiment 8

Embodiment 1 showed the steps of forming the first and third gate electrodes from Ta, forming the second gate electrode from Cr, and removing only the second gate electrode by wet etching. In this embodiment, the combination of the first and third gate electrodes and the second gate electrode differs from that in Embodiment 1.

In this embodiment, the first and third gate electrodes were made from aluminum and the second gate electrode was made from silicon film doped with an impurity to impart conductivity (referred to as conductive silicon film hereinafter). The advantage of forming the second gate electrode from conductive silicon film is that it easily covers the first gate electrode, it easily gives a fine pattern, and it does not diffuse into the insulating film (particularly the gate insulating film). Another advantage is that it is possible to control conductivity easily by doping with an element (such as carbon, nitrogen, and oxygen) belonging to Group 13 or 15 of the periodic table.

The state shown in FIG. 3(D) was obtained according to the steps of Embodiment 1. Then, in the step shown in FIG. 3(E), dry etching was carried out with a fluorine etchant gas (a mixture of $CF_4$ and $O_2$), so that only the second gate electrode was removed. Incidentally, it should be noted that this etching also slightly etches the gate insulating film.

In this embodiment, the etchant gas (fluorine etchant gas) has a large selectivity ratio for the third gate electrode and the second gate electrode; therefore, it was possible to remove only the second gate electrode under good control. Incidentally, the doped silicon for the second gate electrode may be replaced by tantalum (Ta).

The structure in this embodiment may be combined with any of the structure in Embodiments 1 to 7.

Embodiment 9

This embodiment is concerned with the structure of the first gate electrode and the second gate electrode, as shown in FIG. 17.

Figure 17A:
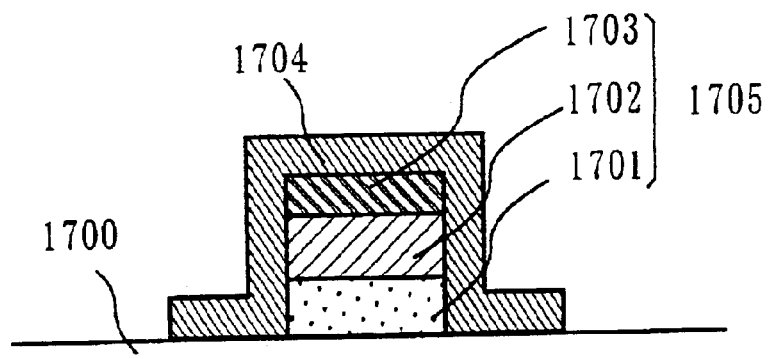

FIG. 17(A) shows an example in which the first gate electrode 1705 on the gate insulating film 1700 is formed from a laminate film composed of the first conducing layer 1701 (of chromium), the second conducting layer 1702 (of copper), and the third conducting layer 1703 (of titanium), and the second gate electrode 1704 was formed from silicon film doped with an impurity to impart conductivity.

The material of the first gate electrode and the material of the second gate electrode greatly differ in selectivity in dry etching (with a mixture of $CF_4$ and $O_2$); therefore, it was possible to selectively leave only the first gate electrode. It was also possible to reduce the wiring resistance by making it from a low-resistance material. An alternative structure may be such that the first gate electrode is formed from a laminate film composed of the first conductive layer 1701 (of titanium), the second conductive layer 1702 (of aluminum), and the third conductive layer 1703 (of titanium), and the second gate electrode is made of tantalum.

Figure 17B:
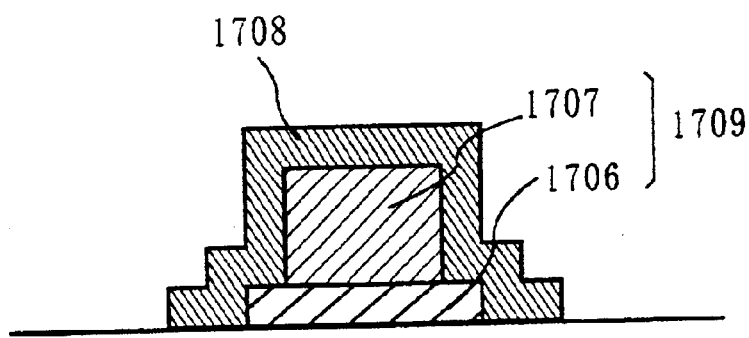

FIG. 17(B) shows the structure in which the first gate electrode 1709 is formed from a laminate film composed of the first conductive layer 1706 (of chromium) and the second conductive layer 1707 (of tantalum), and the second gate electrode 1708 is made of molybdenum.

If the first conductive layer and the second conductive layer are formed such that the latter is narrower than former, then it is possible to form the first gate electrode 1709 stepwise. In this way the second gate electrode 1708 is covered better and troubles (such as breaking) are prevented. Incidentally, there is only one step in this embodiment; however, it is desirable to form a plurality of steps.

Figure 17C:
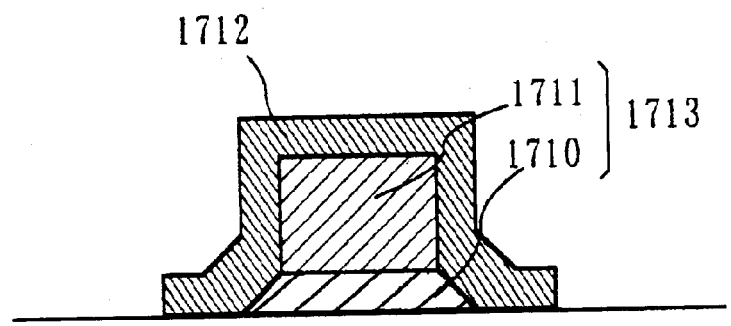

FIG. 17(C) shows the structure in which the first conductive layer 1706 (shown in FIG. 17(B)) is etched aslant. This structure can be obtained if the second conductive layer 1707 is partly etched as shown in FIG. 17(B) and then etching is carried out using the photoresist film remaining in the form of umbrella. In this case, there are shown the first gate electrode 1713 comprising the first conductive layer 1710 (etched aslant) and the second conductive layer 1711, and the second gate electrode 1712.

The angle of slope should be 8–40 degrees. In the structure shown in FIGS. 17(A) and 17(B), the second conductive layer may be etched aslant as well.

The structure in this embodiment may be combined with any of the structure in Embodiments 1 to 8.

Embodiment 10

This embodiment shows that the CMOS circuit and pixel part of the present invention which are obtained in the above-mentioned Embodiments 1 to 9 can be applied to electronic machines and equipment having electro-optical units as the display units (such as active matrix type liquid crystal display, active matrix type EL display, and active matrix type EC display).

Examples of such electronic machines and equipment include video cameras, digital cameras, projectors (of rear type or front type), head-mount display (goggle-type display), car navigator, personal computer, and mobile information terminals (mobile computers, cellular phones, and electronic books). They are illustrated in FIGS. 12 and 18.

Figure 12A:
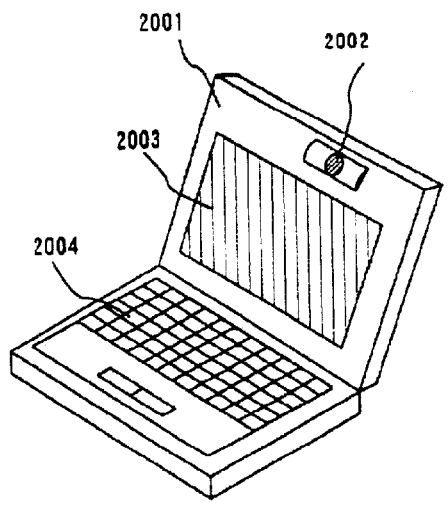

FIG. 12(A) shows a personal computer which consists of main body 2001, image input 2002, display 2003, and keyboard 2004. The present invention may be applied to the image input 2002 and the display 2003 and other signal control circuits.

Figure 12B:
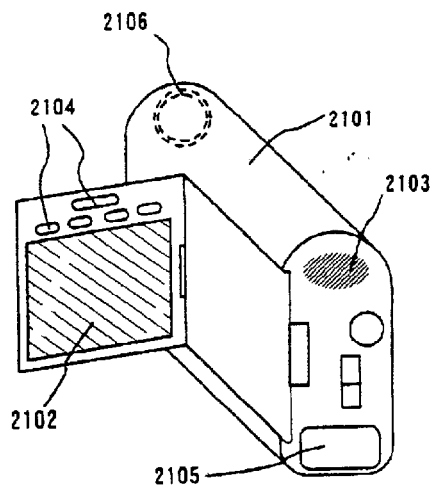

FIG. 12(B) shows a video camera which consists of a main body 2101, a display 2102, an audio input 2103, a switching unit 2104, a battery 2105, and an image receiver 2106. The present invention may be applied to the display 2102 and the video input 2103 and other signal control circuits.

Figure 12C:
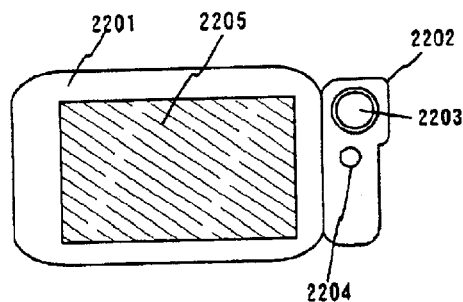

FIG. 12(C) shows a mobile computer which consists of a main body 2201, a camera unit 2202, an image receiver 2203, a switching unit 2204, and a display 2205. The present invention may be applied to the display 2205 and other signal control circuits.

Figure 12D:
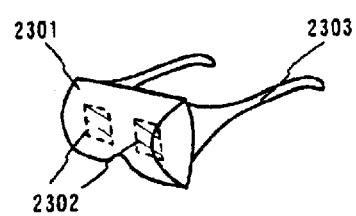

FIG. 12(D) shows a goggle type display which consists of a main body 2301, a display 2302, and arms 2303. The present invention may be applied to the display 2302 and other signal control circuits.

Figure 12E:
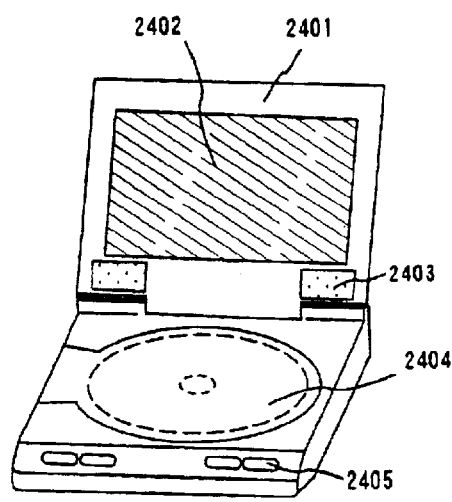

FIG. 12(E) shows a player for a recording medium containing programs, which consists of a main body 2401, a display 2402, a speaker 2403, a recording medium 2404, and a switching unit 2405. Incidentally, this apparatus may employ a DVD (digital versatile disc) or CD as the recording medium. It is used to enjoy music and movies and internet. The present invention may be applied to the display 2402 and other signal control circuits.

Figure 12F:
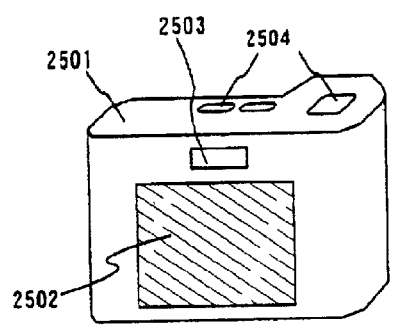

FIG. 12(F) shows a digital camera which consists of a main body 2501, a display 2502, an eyepiece 2503, a switching unit 2504, and an image receiver (not shown). The present invention may be applied to the display 2502 and other signal control circuits.

Figure 18A:
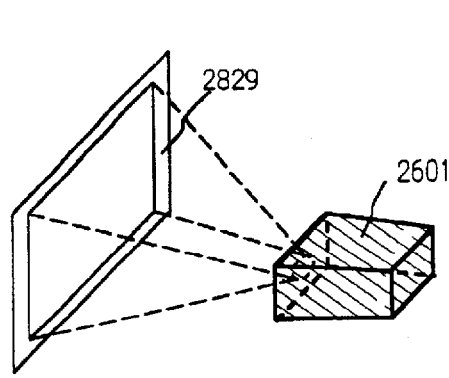

FIG. 18(A) shows a front-type projector which consists of a projector 2601 and a screen 2602. The present invention may be applied to the projector and other signal control circuits.

Figure 18B:
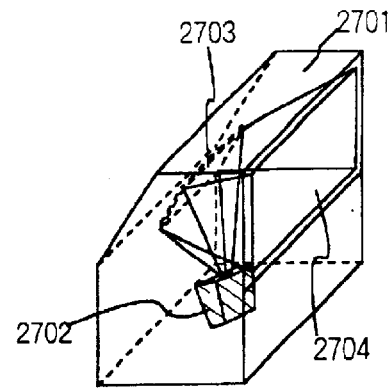

FIG. 18(B) is a rear-type projector which consists of a main body 2701, a projector 2702, a mirror 2703, and a screen 2704. The present invention may be applied to the projector and other signal control circuits.

Figure 18C:
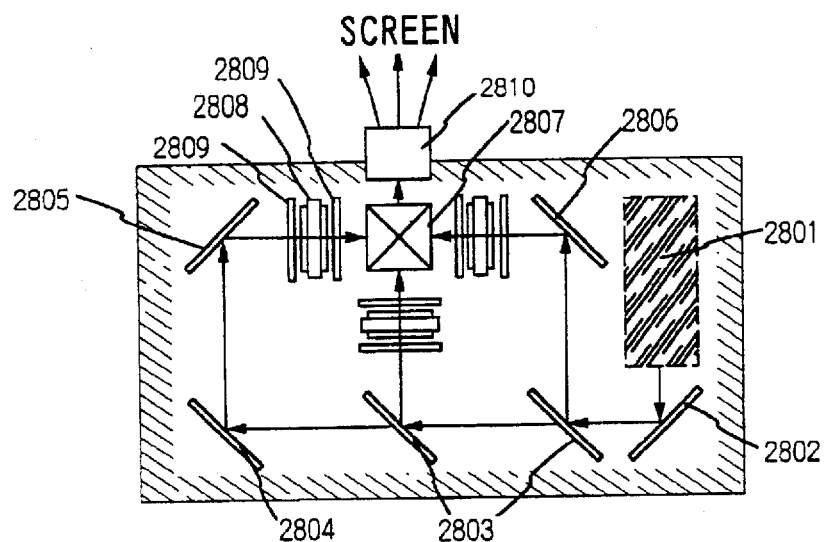

FIG. 18(C) shows an example of the structure of the projectors 2601 and 2702 in FIGS. 18(A) and 18(B), respectively. The projectors 2601 and 2702 each consist of an optical system for light source 2801, mirrors 2802, 2804–2806, a dichroic mirror 2803, a prism 2807, a liquid crystal display 2808, a phase difference plate 2809, and a projecting optical system 2810. The projecting optical system 2810 contains projector lenses. This example shows the one which contains three lenses. The one which has a single lens may also be possible. Incidentally, the example shown in FIG. 18(C) may be modified such that the arrowed optical paths may be provided with such optical elements as lenses, polarizing film, phase difference adjusting film, and IR film.

Figure 18D:
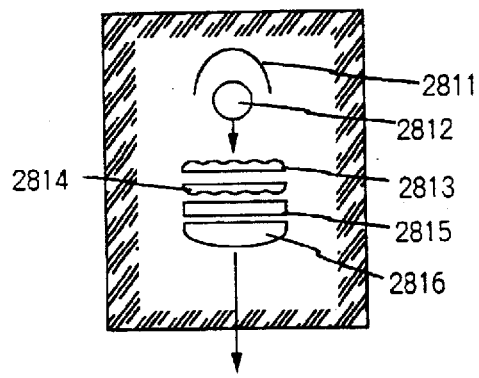

FIG. 18(D) shows an example of the structure of the light source optical system 2801 in FIG. 18(C). The light source optical system 2801 consists of a reflector 2811, a light source 2812, lens arrays 2813 and 2814, a polarizing light converting element 2815, and a condenser lens 2816. The light source optical system shown in FIG. 18(D) is illustrative only but is not limitative. For example, the light source optical system may be provided with such optical elements as lenses, polarizing film, phase difference adjusting film, and IR film.

As mentioned above, the present invention may be applied to a broad range of fields, including almost all electronic machines and equipment. And, the electronic machines and equipment in this example may be realized by any combination of Embodiments 1 to 9.

Embodiment 11

This embodiment demonstrates a process for producing an EL (electroluminescence) display device according to the invention of the present application.

FIG. 19A is a top view showing an EL display device, which was produced according to the invention of the present application. In FIG. 19A, there are shown a substrate 4010, a pixel part 4011, a driving circuit from the source 4012, and a driving circuit from the gate 4013, each driving circuit connecting to wirings 4014–4016 which reach FPC 4017 leading to external equipment.

FIG. 19B is a sectional view showing the structure of the EL display device in this embodiment. The pixel part, preferably together with the driving circuit, is enclosed by a covering material 6000, a sealing material 7000, and an end-sealing material (or second sealing material) 7001.

Furthermore, there is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel type TFT. The TFT 4023 shown is the one, which controls current to the EL element.) These TFTs may be of any known structure (top gate structure or bottom gate structure).

Incidentally, the present invention is used in the TFT 4022 for the driving circuit and the TFT 4023 for the pixel unit.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

Embodiment 12

In this embodiment, another EL display device having a different structure from the embodiment 11 is explained, as shown in FIGS. 20A and 20B. The same reference numerals in FIGS. 20A and 20B as in FIGS. 19A and 19B indicate same constitutive elements, so an explanation is omitted.

FIG. 20A shows a top view of the EL module in this embodiment and FIG. 20B shows a sectional view of A–A' of FIG. 20A.

According to Embodiment 11, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 3404. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

Embodiment 13

In this embodiment, the structure of the pixel region in the EL display panel is illustrated in more detail. FIG. 21 shows the cross section of the pixel region; FIG. 22A shows the top view thereof; and FIG. 22B shows the circuit pattern for the pixel region. In FIG. 21, FIG. 22A and FIG. 22B, the same reference numerals are referred to for the same parts, as being common thereto.

In FIG. 21, the switching TFT 3002 formed on the substrate 3001 is NTFT of the invention (cf. Embodiments 1 to 9). In this Embodiment, it has a double-gate structure, but its structure and fabrication process do not so much differ from the structures and the fabrication processes illustrated hereinabove, and their description is omitted herein. However, the double-gate structure of the switching TFT 3002 has substantially two TFTs as connected in series, and therefore has the advantage of reducing the off-current to pass therethrough. In this Embodiment, the switching TFT 3002 has such a double-gate structure, but is not limitative. It may have a single-gate structure or a triple-gate structure, or even any other multi-gate structure having more than three gates. As the case may be, the switching TFT 3002 may be PTFT of the invention.

The current-control TFT 3003 is NTFT of the invention. The drain wire 3035 in the switching TFT 3002 is electrically connected with the gate electrode 3037 in the current-control TFT, via the wire 3036 therebetween. The wire indicated by 3038 is a gate wire for electrically connecting the gate electrodes 3039a and 3030–3039b in the switching TFT 3002.

It is very important that the current-control TFT 3003 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the gate electrode overlaps with the drain area in the current-control TFT, via a gate-insulating film therebetween.

In this embodiment, the current-control TFT 3003 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 22A, the wire to be the gate electrode 3037 in the current-control TFT 3003 overlaps with the drain wire 3040 therein in the region indicated by 3004, via an insulating film therebetween. In this state, the region indicated by 3004 forms a capacitor. The capacitor 3004 functions to retain the voltage applied to the gate in the current-control TFT 3003. The drain wire 3040 is connected with the current supply line (power line) 3006, from which a constant voltage is all the time applied to the drain wire 3040.

On the switching TFT 3002 and the current-control TFT 3003, formed is a first passivation film 3041. On the film 3041, formed is a planarizing film 3042 of an insulating resin. It is extremely important that the difference in level of the layered parts in TFT is removed through planarization with the planarizing film 3042. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 3043 indicates a pixel electrode (a cathode in the EL device) of an electroconductive film with high reflectivity. The pixel electrode 3043 is electrically connected with the drain in the current-control TFT 3003. It is preferable that the pixel electrode 3043 is of a low-resistance electroconductive film of an aluminium alloy, a copper alloy or a silver alloy, or of a laminate of those films. Needless-to-say, the pixel electrode 3043 may have a laminate structure with any other electroconductive films.

In the recess (this corresponds to the pixel) formed between the banks 3044a and 3044b of an insulating film (preferably of a resin), the light-emitting layer 3045 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include poly-paraphenylenevinylene (PVV) materials, polyvinylcarbazole (PVK) materials, polyfluorene materials, etc.

Various types of PVV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33–37" and in Japanese Patent Laid-Open No. 92576/1998. Any of such known materials are usable herein.

Concretely, cyanopolyphenylenevinylenes may be used for red-emitting layers; polyphenylenevinylenes may be for green-emitting layers; and polyphenylenevinylenes or poly-alkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 46 of PEDOT (polythiophene) or PAni (polyaniline) is formed on the light-emitting layer 45 to give a laminate structure for the EL layer. On the hole injection layer 46, formed is an anode 47 of a transparent electroconductive film. In this Embodiment, the light having been emitted by the light-emitting layer 45 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 3047 is formed, the EL device 3005 is finished. The EL device 3005 thus fabricated herein indicates a capacitor comprising the pixel electrode (cathode) 3043, the light-emitting layer 3045, the hole injection layer 3046 and the anode 3047. As in FIG. 22A, the region of the pixel electrode 3043 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 3048 is formed on the anode 3047. For the second passivation film 3048, preferably used is a silicon nitride film or a silicon oxynitride film. The object of the film 3048 is to insulate the EL device from the outward environment. The film 3048 has the function of preventing the organic EL material from being degraded through oxidation and has the function of preventing it from degassing. With the second passivation film 3048 of that type, the reliability of the EL display device is improved.

As described hereinabove, the EL display panel of the invention fabricated in this Embodiment has a pixel region for the pixel having the constitution as in FIG. 21, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 1 to 9 in any desired manner. Incorporating the EL display panel of this Embodiment into the electronic appliance of Embodiment 10 as its display part is advantageous.

Embodiment 14

This Embodiment is to demonstrate a modification of the EL display panel of Embodiment 13, in which the EL device 3005 in the pixel region has a reversed structure. For this Embodiment, referred to is FIG. 23. The constitution of the EL display panel of this Embodiment differs from that illustrated in FIG. 22A only in the EL device part and the current-control TFT part. Therefore, the description of the other parts except those different parts is omitted herein.

In FIG. 23, the current-control TFT 3103 may be PTFT of the invention. For the process of forming it, referred to is that of Embodiment 1 to 9.

In this Embodiment, the pixel electrode (anode) 3050 is of a transparent electroconductive film. Concretely, used is an electroconductive film of a compound of indium oxide and zinc oxide. Needless-to-say, also usable is an electroconductive film of a compound of indium oxide and tin oxide.

After the banks 3051a and 3051b of an insulating film have been formed, a light-emitting layer 3052 of polyvinylcarbazole is formed between them in a solution coating method. On the light-emitting layer 3052, formed are an electron injection layer 3053 of acetylacetonatopotassium (hereinafter acacK), and a cathode 3054 of an aluminum alloy. In this case, the cathode 3054 serves also as a passivation film. Thus is fabricated the EL device 3101.

In this Embodiment, the light having been emitted by the light-emitting layer 3052 radiates in the direction toward the substrate with TFT formed thereon, as in the direction of the arrow illustrated.

The constitution of this Embodiment can be combined with any constitution of Embodiments 1 to 9 in any desired manner. Incorporating the EL display panel of this Embodiment into the electronic appliance of Embodiment 10 as its display part is advantageous.

Embodiment 15

This Embodiment is to demonstrate modifications of the pixel with the circuit pattern of FIG. 22B. The modifications are as in FIG. 24A to FIG. 24C. In this Embodiment illustrated in those FIG. 24A to FIG. 24C, 3201 indicates the source wire for the switching TFT 3202; 3203 indicates the gate wire for the switching TFT 3202; 3204 indicates a current-control TFT; 3205 indicates a capacitor; 3206 and 3208 indicate current supply lines; and 3207 indicates an EL device.

In the embodiment of FIG. 32A, the current supply line 3206 is common to the two pixels. Specifically, this embodiment is characterized in that two pixels are lineal-symmetrically formed with the current supply line 3206 being the center between them. Since the number of current supply lines can be reduced therein, this embodiment is advantageous in that the pixel pattern can be much finer and thinner.

In the embodiment of FIG. 32B, the current supply line 3208 is formed in parallel to the gate wire 3203. Specifically, in this, the current supply line 3208 is so constructed that it does not overlap with the gate wire 3203, but is not limitative. Being different from the illustrated case, the two may overlap with each other via an insulating film therebetween so far as they are of different layers. Since the current supply line 3208 and the gate wire 3203 may enjoy the common exclusive area therein, this embodiment is advantageous in that the pixel pattern can be much finer and thinner.

Figure 24B:
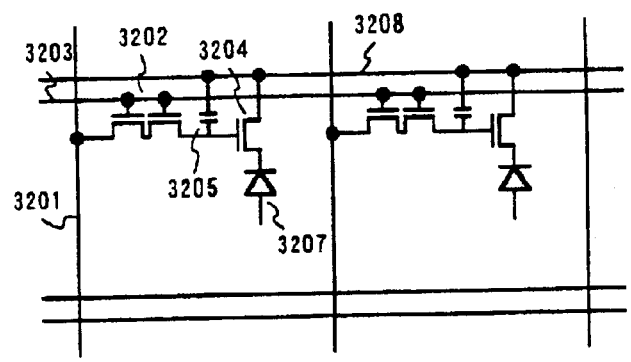

The structure of the embodiment of FIG. 32C is characterized in that the current supply line 3208 is formed in parallel to the gate wires 3203, like in FIG. 24B, and that two pixels are lineal-symmetrically formed with the current supply line 3808 being the center between them. In this, it is also effective to provide the current supply line 3208 in such a manner that it overlaps with any one of the gate wires 3203. Since the number of current supply lines can be reduced therein, this embodiment is advantageous in that the pixel pattern can be much finer and thinner.

The constitution of this Embodiment can be combined with any constitution of Embodiment 1 to 9 in any desired manner. Incorporating the EL display panel having the pixel structure of this Embodiment into the electronic appliance of Embodiment 10 as its display part is advantageous.

Embodiment 16

The embodiment of Embodiment 13 illustrated in FIG. 22A and FIG. 22B is provided with the capacitor 3004 which acts to retain the voltage applied to the gate in the current-control TFT 3003. In the embodiment, however, the capacitor 3004 may be omitted.

In the embodiment of Embodiment 13, the current-control TFT 3003 is NTFT of the invention, as shown in Embodiments 1 to 9. Therefore, in the embodiment, the LDD region is so formed that it overlaps with the gate electrode via the gate-insulating film therebetween. In the overlapped region, formed is a parasitic capacitance generally referred to as a gate capacitance. The embodiment of this Embodiment is characterized in that the parasitic capacitance is positively utilized in place of the capacitor 3004.

The parasitic capacitance in question varies, depending on the area in which the gate electrode overlaps with the LDD region, and is therefore determined according to the length of the LDD region in the overlapped area.

Figure 24C:
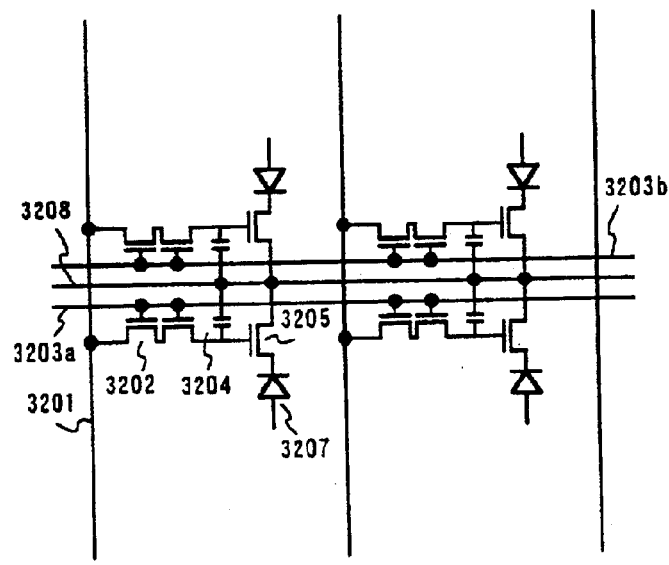

Also in the embodiments of Embodiment 15 illustrated in FIG. 22A, FIG. 24B and FIG. 24C, the capacitor 3205 can be omitted.

The constitution of this Embodiment can be combined with any constitution of Embodiment 1 to 9 in any desired manner. Incorporating the EL display panel having the pixel structure of this Embodiment into the electronic appliance of Embodiment 10 as its display part is advantageous.

[Effect of the Invention]

The present invention enables one to produce simultaneously NTFT capable of high speed driving with a large on-current and NTFT with a controlled off-current. As the result, it is possible to improve reliability for the semiconductor device containing CMOS circuits with TFT made of crystalline semiconductor or, to be concrete, the pixel part of the liquid crystal unit and its peripheral driving circuits.

At the same time, it is possible to form semiconductor circuits with high reliability and good electrical properties by forming CMOS circuits by combination of NTFT and PTFT with well-balanced characteristics.

The high reliability of the circuit with TFT leads to the high reliability of electro-optical devices, semiconductor circuits, and all semiconductor devices including electronic machines and equipment.

What is claimed is:

1. A semiconductor device comprising:
    at least first and second N-channel thin film transistors electrically formed over said substrate, each of the first and second N-channel thin film transistors comprising:
        a semiconductor island having a pair of first impurity regions doped with an n-type impurity, a channel region between the first impurity regions, and a pair of second impurity regions between said channel region and the first impurity regions wherein a concentration of the n-type impurity in the second impurity regions is smaller than that in the first impurity regions;
        a gate insulating film formed over the semiconductor island; and
        a gate electrode formed over the semiconductor island with the gate insulating film interposed therebetween, said gate electrode comprising at least a first conductive layer;
    an insulating film formed on and in direct contact with an upper surface of the first conductive layer of the gate electrode of the first N-channel thin film transistor,
    wherein the gate electrode of the second N-channel thin film transistor further comprises a second conductive layer over said first conductive layer and said second conductive layer extends beyond side edges of the first conductive layer to overlap said pair of second impurity regions.

2. A semiconductor device comprising:
    a plurality of pixel electrodes formed over a substrate;
    at least one first N-channel thin film transistor electrically connected to one of said plurality of pixel electrodes;
    a driver circuit comprising at least one second N-channel thin film transistor formed over said substrate, each of the first and second N-channel thin film transistors comprising:
        a semiconductor island having a pair of first impurity regions doped with an n-type impurity, a channel region between the first impurity regions, and a pair of second impurity regions between said channel region and the first impurity regions wherein a concentration of the n-type impurity in the second impurity regions is smaller than that in the first impurity regions;
        a gate insulating film formed over the semiconductor island; and
        a gate electrode formed over the semiconductor island with the gate insulating film interposed therebetween, said gate electrode comprising at least a first conductive layer;
    an insulating film formed on and in direct contact with an upper surface of the first conductive layer of the gate electrode of the first N-channel thin film transistor,
    wherein the gate electrode of the second N-channel thin film transistor further comprises a second conductive layer over said first conductive layer and said second conductive layer extends beyond side edges of the first conductive layer to overlap said pair of second impurity regions.

3. A semiconductor device comprising:
    a plurality of pixel electrodes formed over a substrate;
    at least one first N-channel thin film transistor electrically connected to one of said plurality of pixel electrodes;
    a CMOS circuit comprising at least one second N-channel thin film transistor and a P-channel thin film transistor formed over said substrate,
    wherein each of the first and second N-channel thin film transistors comprising:
        a semiconductor island having a pair of first impurity regions, a channel region between the first impurity regions, and a pair of second impurity regions between said channel region and the first impurity regions;
        a gate insulating film formed over the semiconductor island; and
        a gate electrode formed over the semiconductor island with the gate insulating film interposed therebetween, said gale electrode comprising at least a first conductive layer;
    an insulating film formed on and in direct contact with an upper surface of the first conductive layer of the gate electrode of the first N-channel thin film transistor,
    wherein the gate electrode of the second N-channel thin film transistor further comprises a second conductive layer over said first conductive layer and said second conductive layer extends beyond side edges of the first conductive layer to overlap said pair of second impurity regions.

4. A semiconductor device comprising:
    at least first and second P-channel thin film transistors formed over a substrate, each of the first and second P-channel thin film transistors comprising:
        a semiconductor island having a pair of first impurity regions doped with a p-type impurity, a channel region between the first impurity regions and a pair of second impurity regions between said channel region and the first impurity regions;
        a gate insulating film formed over the semiconductor island; and
        a gate electrode formed over the semiconductor island with the gate insulating film interposed therebetween, said gate electrode comprising at least a first conductive layer,
    an insulating film formed on and in direct contact with an upper surface of the first conductive layer of the gate electrode of the first P-channel thin film transistor,
    wherein the gate electrode of the second P-channel thin film transistor further comprises a second conductive layer over said first conductive layer and said second conductive layer extends beyond side edges of the first conductive layer to overlap said pair of second impurity regions.

5. A semiconductor device comprising:
    at least first and second N-channel thin film transistors formed over a substrate, each of the first and second N-channel thin film transistors comprising:

a semiconductor island having a pair of first impurity regions doped with an n-type impurity, a channel region between the first impurity regions, and a pair of second impurity regions between said channel region and the first impurity regions wherein a concentration of the n-type impurity in the second impurity regions is smaller than that in the first impurity regions;

a gate insulating film formed over the semiconductor island; and a gate electrode formed over the semiconductor island with the gate insulating film interposed therebetween, said gate electrode comprising at least a first conductive layer, wherein the second impurity regions are not overlapped with the gate electrode thereof in the first N-channel thin film transistor; and wherein the gate electrode of the second N-channel thin film transistor further comprises a second conductive layer over said first conductive layer and said second conductive layer extends beyond side edges of the first conductive layer to overlap said pair of second impurity regions.

6. A semiconductor device comprising:

a plurality of pixel electrodes formed over a substrate;

at least one first N-channel thin film transistor electrically connected to one of said plurality of pixel electrodes;

a driver circuit comprising at least one second N-channel thin film transistor formed over said substrate, each of the first and second N-channel thin film transistors comprising:

a semiconductor island having a pair of first impurity regions doped with an n-type impurity, a channel region between the first impurity regions, and a pair of second impurity regions between said channel region and the first impurity regions wherein a concentration of the n-type impurity in the second impurity regions is smaller than that in the first impurity regions;

a gate insulating film formed over the semiconductor island; and a gate electrode formed over the semiconductor island with the gate insulating film interposed therebetween, said gate electrode comprising at least a first conductive layer;

wherein the gate electrode of the second N-channel thin film transistor further comprises a second conductive layer over said first conductive layer and said second conductive layer extends beyond side edges of the first conducive layer to overlap said pair of second impurity regions, and wherein, in the fist N-channel thin film transistor, the second impurity regions are not overlapped with the gate electrode.

7. A semiconductor device comprising:

a plurality of pixel electrodes formed over a substrate;

at least one first N-channel thin film transistor electrically connected to one of said plurality of pixel electrodes;

a CMOS circuit comprising at least one second N-channel thin film transistor and a P-channel thin film transistor formed over said substrate, wherein each of the first and second N-channel thin film transistors comprising:

a semiconductor island having a pair of first impurity regions, a channel region between the first impurity regions, and a pair of second impurity regions between said channel region and the first impurity regions;

a gate insulating film formed over the semiconductor island; and a gate electrode formed over the semiconductor island with the gate insulating film interposed therebetween, said gate electrode comprising at least a first conductive layer;

wherein, in the second N-channel thin film transistor, the gate electrode further comprises a second conductive layer over said first conductive layer and said second conductive layer extends beyond side edges of the that conductive layer to overlap said pair of second impurity regions, and wherein, in the first N-channel thin film transistor, the second impurity regions are not overlapped with the gate electrode.

8. The semiconductor device according to claim 1 wherein said first conductive layer comprises a material selected from the group consisting of Ta, TaN, Ti, Cr, W, Mo, Si, Al, and Cu.

9. The semiconductor device according to claim 1 wherein said second conductive layer comprises a material selected from the group consisting of Al, Ti, Cr, W and Mo.

10. The semiconductor device according to claim 1 wherein said semiconductor device is a liquid crystal display device.

11. The semiconductor device according to claim 1 wherein said semiconductor device is an electroluminescence display device.

12. The semiconductor device according to claim 2 wherein said first conductive layer comprises a material selected from the group consisting of Ta, TaN, Ti, Cr, W, Mo, Si, Al, and Cu.

13. The semiconductor device according to claim 2 wherein said second conductive layer comprises a material selected from the group consisting of Al, Ti, Cr, W and Mo.

14. The semiconductor device according to claim 2 wherein said semiconductor device is a liquid crystal display device.

15. The semiconductor device according to claim 2 wherein said semiconductor device is an electroluminescence display device.

16. The semiconductor device according to claim 3 wherein said first conductive layer comprises a material selected from the group consisting of Ta, TaN, Ti, Cr, W, Mo, Si, Al, and Cu.

17. The semiconductor device according to claim 3 wherein said second conductive layer comprises a material selected from the group consisting of Al, Ti, Cr, W and Mo.

18. The semiconductor device according to claim 3 wherein said semiconductor device is a liquid crystal display device.

19. The semiconductor device according to claim 3 wherein said semiconductor device is an electroluminescence display device.

20. The semiconductor device according to claim 4 wherein said first conductive layer comprises a material selected from the group consisting of Ta, TaN, Ti, Cr, W, Mo, Si, Al, and Cu.

21. The semiconductor device according to claim 4 wherein said second conductive layer comprises a material selected from the group consisting of Al, Ti, Cr, W and Mo.

22. The semiconductor device according to claim 4 wherein said semiconductor device is a liquid crystal display device.

23. The semiconductor device according to claim 4 wherein said semiconductor device is an electroluminescence display device.

24. The semiconductor device according to claim 5 wherein said first conductive layer comprises a material selected from the group consisting of Ta, TaN, Ti, Cr, W, Mo, Si, Al, and Cu.

25. The semiconductor device according to claim 5 wherein said second conductive layer comprises a material selected from the group consisting of Al, Ti, Cr, W and Mo.

26. The semiconductor device according to claim 5 wherein said semiconductor device is a liquid crystal display device.

27. The semiconductor device according to claim 5 wherein said semiconductor device is an electroluminescence display device.

28. The semiconductor device according to claim 6 wherein said first conductive layer comprises a material selected from the group consisting of Ta, TaN, Ti, Cr, W, Mo, Si, Al, and Cu.

29. The semiconductor device according to claim 6 wherein said second conductive layer comprises a material selected from the group consisting of Al, Ti, Cr, W and Mo.

30. The semiconductor device according to claim 6 wherein said semiconductor device is a liquid crystal display device.

31. The semiconductor device according to claim 6 wherein said semiconductor device is an electroluminescence display device.

32. The semiconductor device according to claim 7 wherein said first conductive layer comprises a material selected from the group consisting of Ta, TaN, Ti, Cr, W, Mo, Si, Al, and Cu.

33. The semiconductor device according to claim 7 wherein said second conductive layer comprises a material selected from the group consisting of Al, Ti, Cr, W and Mo.

34. The semiconductor device according to claim 7 wherein said semiconductor device is a liquid crystal display device.

35. The semiconductor device according to claim 7 wherein said semiconductor device is an electroluminescence display device.

36. A semiconductor device comprising:
at least first and second N-channel thin film transistors formed over a substrate, each of the first and second N-channel thin film transistors comprising:
a semiconductor island having a pair of first impurity regions doped with an n-type impurity, a channel region between the first impurity regions and a pair of second impurity regions between said channel region and the first impurity regions wherein a concentration of the n-type impurity in the second impurity regions is smaller than that in the first impurity regions;
a gate insulating film formed over the semiconductor island; and
a gate electrode formed over the semiconductor or island with the gate insulating film interposed there between, said gate electrode comprising at least a first conductive layer and a second conductive layer formed on the first conductive layer wherein said first conductive layer extends beyond side edges of the second conductive layer;
an insulating film formed on and in direct contact with an upper surface of the second conductive layer of the gate electrode of the first N-channel thin film transistor,
wherein the gate electrode of the second N-channel thin film transistor further comprises a third conductive layer over said second conductive layer and said third conductive layer extends beyond side edges of the first conductive layer to overlap said paw of second impurity regions.

37. A semiconductor device comprising:
a plurality of pixel electrodes formed over a substrate;
at least one first N-channel thin film transistor electrically connected to one of said plurality of pixel electrodes;
a driver circuit comprising at least one second N-channel thin film transistor formed over said substrate, each of the first and second N-channel thin film transistors comprising:
a semiconductor island having a pair of first impurity regions doped with an n-type impurity, a channel region between the first impurity regions, and a pair of second impurity regions between said channel region and the first impurity regions wherein a concentration of the n-type impurity in the second impurity regions is smaller than that in the first impurity regions;
a gate insulating film formed over the semiconductor island; and
a gate electrode formed over the semiconductor island with the gate insulating film interposed therebetween, said gate electrode comprising at least a first conductive layer and a second conductive layer formed on the first conductive layer wherein said first conductive layer extends beyond side edges of the second conductive layer;
an insulating film formed on and in direct contact with an upper surface of the second conductive layer of the gate electrode of the first N-channel thin film transistor,
wherein the gate electrode of the second N-channel thin film transistor further comprises a third conductive layer over said second conductive layer and said third conductive layer extends beyond side edges of the first conductive layer to overlap said pair of second impurity regions.

38. A semiconductor device comprising:
at least first and second N-channel thin film transistors formed over a substrate, each of the first and second N-channel thin film transistors comprising:
a semiconductor island having a pair of first impurity regions doped with an n-type impurity, a channel region between the first impurity regions, and a pair of second impurity regions between said channel region and the first impurity regions wherein a concentration of the n-type impurity in the second impurity regions is smaller than that in the first impurity regions;
a gate insulating film formed aver the semiconductor island; and
a gate electrode formed over the semiconductor island with the gate insulating film interposed therebetween, said gate electrode comprising at least a first conductive layer and a second conductive layer formed on the first conductive layer wherein said first conductive layer extends beyond side edges of the second conductive layer,
wherein the second impurity regions are not overlapped with the gate electrode thereof in the first N-channel thin film transistor; and
wherein the gate electrode of the second N-channel thin film transistor further comprises a third conductive layer over, said second conductive layer and said third conductive layer extends beyond side edges of the first conductive layer to overlap said pair of second impurity regions.

39. A semiconductor device comprising:

a plurality of pixel electrodes formed over a substrate;

at least one first N-channel thin film transistor electrically connected to one of said plurality of pixel electrodes;

a driver circuit comprising at least one second N-channel thin film transistor formed over said substrate each of the first and second N-channel thin film transistors comprising:

- a semiconductor island having a pair of first impurity regions doped with an n-type impurity, a channel region between the first impurity regions, and a pair of second impurity regions between said channel region and the first impurity regions wherein a concentration of the n-type impurity in the second impurity regions is smaller than that in the first impurity regions;
- a gate insulating film formed over the semiconductor island; and
- a gate electrode formed over the semiconductor island with the gate insulating film interposed therebetween, said gate electrode comprising at least a first conductive layer and a second conductive layer formed on the first conductive layer wherein said first conductive layer extends beyond side edges of the second conductive layer;

wherein the gate electrode of the second N-channel thin film transistor further comprises a third conductive layer over said second conductive layer and said third conductive layer extends beyond side edges of the first conductive layer to overlap said pair of second impurity regions, and, wherein, in the fist N-channel thin film transistor, the second impurity regions are not overlapped with the gate electrode.

40. The semiconductor device according to claim 36 wherein said first conductive layer comprises a different material from said second conductive layer.

41. The semiconductor device according to claim 36 wherein said semiconductor device is a liquid crystal display device.

42. The semiconductor device according to claim 36 wherein said semiconductor device is an electroluminescence display device.

43. The semiconductor device according to claim 37 wherein said first conductive layer comprises a different material from said second conductive layer.

44. The semiconductor device according to claim 37 wherein said semiconductor device is a liquid crystal display device.

45. The semiconductor device according to claim 37 wherein said semiconductor device is an electroluminescence display device.

46. The semiconductor device according to claim 38 wherein said first conductive layer comprises a different material from said second conductive layer.

47. The semiconductor device according to claim 38 wherein said semiconductor device is a liquid crystal display device.

48. The semiconductor device according to claim 38 wherein said semiconductor device is an electroluminescence display device.

49. The semiconductor device according to claim 39 wherein said first conductive layer comprises a different material frozen said second conductive layer.

50. The semiconductor device according to claim 39 wherein said semiconductor device is a liquid crystal display device.

51. The semiconductor device according to claim 39 wherein said semiconductor device is an electroluminescence display device.

* * * * *